(12) United States Patent
Umematsu

(10) Patent No.: US 8,780,554 B2
(45) Date of Patent: Jul. 15, 2014

(54) ELECTRONIC DEVICE

(75) Inventor: Misao Umematsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 201 days.

(21) Appl. No.: 13/447,855

(22) Filed: Apr. 16, 2012

(65) Prior Publication Data

US 2012/0195001 A1    Aug. 2, 2012

Related U.S. Application Data

(63) Continuation of application No. PCT/JP2009/067931, filed on Oct. 16, 2009.

(51) Int. Cl.
*H05K 7/20* (2006.01)

(52) U.S. Cl.
USPC .......... 361/692; 361/690; 361/720; 361/721; 361/752; 361/796; 312/236

(58) Field of Classification Search
USPC .............. 361/679.48–679.49, 690, 692, 748, 361/752, 784, 788, 790, 796, 800; 312/236
See application file for complete search history.

(56) References Cited

U.S. PATENT DOCUMENTS

| 5,243,493 | A | * | 9/1993 | Jeng et al. ................ 361/690 |
| 5,510,954 | A | | 4/1996 | Wyler |
| 5,596,483 | A | | 1/1997 | Wyler |
| 5,852,547 | A | | 12/1998 | Kitlas et al. |
| 6,061,245 | A | * | 5/2000 | Ingraham et al. .......... 361/749 |
| 6,504,718 | B2 | * | 1/2003 | Wu ........................ 361/695 |
| 6,835,070 | B1 | | 12/2004 | Law |
| 7,230,827 | B2 | * | 6/2007 | Sun et al. .................. 361/695 |
| 7,440,277 | B2 | * | 10/2008 | Musgrave et al. .......... 361/695 |
| 7,499,285 | B2 | * | 3/2009 | Chen et al. ................ 361/752 |
| 7,564,696 | B1 | * | 7/2009 | Winick et al. .............. 361/801 |
| 7,606,044 | B2 | * | 10/2009 | Bailey et al. .............. 361/752 |
| 7,791,875 | B2 | * | 9/2010 | Kumano et al. ........ 361/679.49 |
| 8,472,210 | B2 | * | 6/2013 | Chiu et al. ................ 361/801 |
| 2008/0259579 | A1 | | 10/2008 | Chen et al. |
| 2008/0304228 | A1 | | 12/2008 | Bailey et al. |
| 2012/0281373 | A1 | * | 11/2012 | Bohannon et al. .......... 361/756 |
| 2013/0128464 | A1 | * | 5/2013 | Chen et al. ................ 361/721 |

FOREIGN PATENT DOCUMENTS

| CN | 2504680 | 8/2002 |
| JP | 63-155694 | 10/1988 |
| JP | 10-500792 | 1/1998 |
| JP | 11-134068 | 5/1999 |
| JP | 2002-366258 | 12/2002 |
| JP | 2008-251083 | 10/2008 |

OTHER PUBLICATIONS

International Search Report of PCT/JP2009/067931 mailed Nov. 10, 2009.
Chinese Office Action mailed Jan. 27, 2014 in corresponding Chinese Application No. 200980161973.0.
Extended European Search Report mailed May 21, 2014 in related European Application No. 09850406.1.

* cited by examiner

*Primary Examiner* — Robert J Hoffberg
(74) *Attorney, Agent, or Firm* — Staas & Halsey LLP

(57) ABSTRACT

An IO system board included in an electronic device includes, in addition to a first section board that includes first ventilating holes and second section board that includes second ventilating holes, a third section board that includes third ventilating holes. Accordingly, a larger amount of cooling air is taken in via an air intake surface of a rack of the electronic device, flows into a casing of the IO system board, and then flows over a first sub circuit board, thus cooling a first heat-generating component.

9 Claims, 15 Drawing Sheets

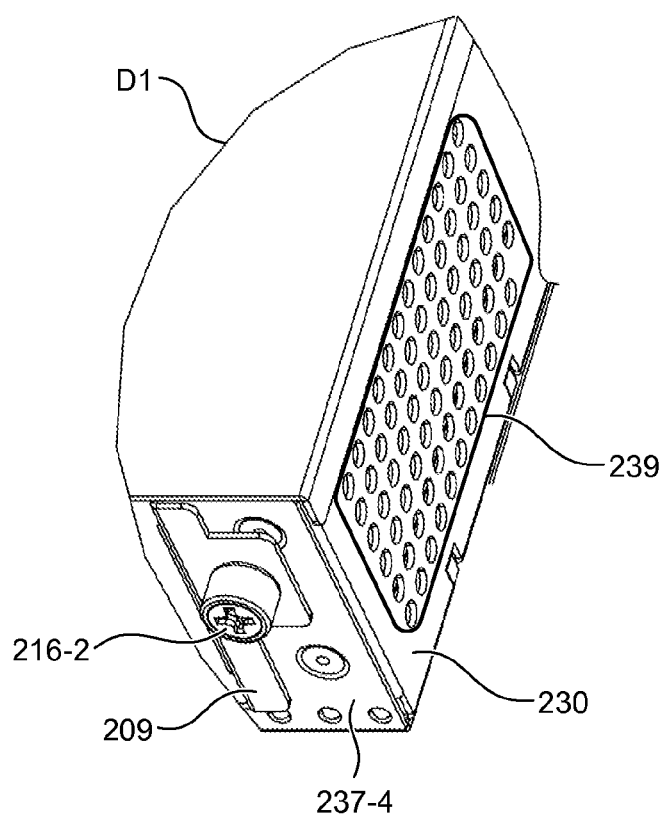

ELECTRONIC DEVICE

CROSS-REFERENCE TO RELATED APPLICATION

This application is a continuation of International Application No. PCT/JP2009/067931, filed on Oct. 16, 2009, the entire contents of which are incorporated herein by reference.

FIELD

The embodiments discussed herein are directed to an electronic device.

BACKGROUND

In electronic devices, high-density mounting of components is usually implemented by mounting sub circuit boards on printed circuit boards that are arranged in a casing or a chassis. Electronic components, which generate heat when they are operated, are mounted on the printed circuit boards and the sub circuit boards. An increase in temperature of an electronic device due to heat generated by the electronic components causes the electronic device to operate abnormally. Accordingly, in electronic devices, electronic components that generate heat need to be cooled.

With conventional technology, when a sub circuit board is mounted on a printed circuit board that is arranged in a casing of an electronic device, multiple riser units in which a sub circuit board is mounted on a riser card are usually mounted on the printed circuit board. Furthermore, as illustrated in FIG. 11A and FIG. 11B, on a system board 20, a riser unit U1 and a riser unit U2 are usually mounted on a main circuit board 12 such that a section board 9 of the riser unit U1 and a section board 7 of the riser unit U2 are aligned in the same plane as that of the front surface S, which is perpendicular to a main circuit board 12.

The electronic components mounted on the sub circuit board on the riser unit U1 are cooled by cooling air flowing from ventilating holes included in the section board 9, whereas the electronic components mounted on the sub circuit board on the riser unit U2 are cooled by cooling air flowing from vent holes and ventilating holes 22 included in the section board 7.

Furthermore, there is a known technology in which, when multiple printed circuit boards having mounted thereon electronic components in a casing of the electronic device are mounted in parallel in the casing of the electronic device, the multiple printed circuit boards are mounted by shifting, from among the multiple printed circuit boards, the arrangement position of one printed circuit board forward or backward with respect to the other printed circuit board. Furthermore, there is also a known technology for forming a single casing by dividing a casing of an electronic device into two, by shifting one divided casing in the vertical direction with respect to the other divided casing, and by combining the two divided casings.

Then, air intake and discharge holes, through which cooling air flows that cools the electronic components, are arranged at a portion created by shifting the position of the printed circuit board forward or backward with respect to the other printed circuit board. Alternatively, the air intake and discharge holes are arranged at a portion created by shifting one part of a divided casing in the vertical direction with respect to the other part of the divided casing and by combining the two divided casings. As described above, with the conventional technology, the efficiency with which the electronic components mounted on the printed circuit board are cooled may be improved by increasing the number of air intake and discharge holes and by causing a larger amount of cooling air to flow over the printed circuit board arranged in the casing.

Patent Literature 1: Japanese Laid-open Patent Publication No. 2002-366258

Patent Literature 2: Japanese Laid-open Patent Publication No. 2008-251083

However, with the conventional technology described above, because the number of air intake ports is insufficient, there is a problem in that the cooling efficiency of the entire system board 20 including the electronic components mounted on the sub circuit board on the riser unit is low.

Specifically, as illustrated in FIG. 11A, the electronic components on the sub circuit board on the riser unit U2 are cooled by the cooling air flowing from the vent holes and the ventilating holes 22 that are included in the section board 7. However, the electronic components on the sub circuit board on the riser unit U1 are cooled only by the cooling air flowing from the vent holes that are included in the section board 9. Accordingly, with the conventional technology, because the amount of cooling air flowing over the system board 20 is insufficient, the cooling efficiency of the entire system board 20 including the electronic components mounted on each of the sub circuit boards of the riser unit U1 and the riser unit U2 is low.

SUMMARY

According to an aspect of an embodiment of the invention, an electronic device includes a casing that includes a top plate, a base plate that is arranged opposite the top plate, a first side surface plate, a second side surface plate that is arranged opposite the first side surface plate, a back surface plate, a first section board that is arranged opposite the back surface plate and that has first ventilating holes, a second section board that is arranged, by being shifted forward, parallel to the first section board and that has second ventilating holes, and a third section board that is arranged among the top plate, the base plate, the first section board, and the second section board, that is arranged parallel to the first side surface plate, and that has third ventilating holes, a main circuit board that is arranged in a space in the casing and a first sub circuit board that has a first heat-generating component and that is arranged in a space bounded by the second section board and the third section board on the main circuit board.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 5C is a detailed diagram illustrating a portion of the IO system board according to an example of the second embodiment;

DESCRIPTION OF EMBODIMENTS

Preferred embodiments of an electronic device disclosed in the present invention will be described in detail below with reference to the accompanying drawings. In the examples of the embodiments, a description will be given by using a server device as an example of the electronic device, in which an input output (IO) system board, i.e., a printed circuit board having mounted thereon electronic components is arranged in a casing or a chassis. The IO system board is a connecting interface that is used by the electronic device in order to transmit and receive data to/from an external unit.

In the following embodiments described below as an example, a description will be given of a case in which, in order to improve the packaging density of the electronic components, a sub circuit board is mounted, in parallel, on a main circuit board on the IO system board via a connecting circuit board that is referred to as a riser card. The riser card is arranged perpendicular to the main circuit board on the IO system board. The sub circuit board is, for example, a peripheral component interconnect (PCI) card that expands the functions, such as network interfaces, arranged perpendicular to, for example, the riser card. In this way, the sub circuit board is mounted on the main circuit board in parallel.

The casing of the electronic device is a server rack (hereinafter, referred to as a "rack"). The IO system board is a unit in which the main circuit board, the sub circuit board, and the riser card are arranged in the casing thereof. The electronic components may also include, for example, a central processing unit (CPU), a micro processing unit (MPU), or a micro control unit (MCU). Furthermore, the electronic components may also include, for example, a random access memory (RAM) or a read only memory (ROM).

The technology disclosed in the present invention may be widely used for an electronic device that includes, in a unit in the casing, at least one printed circuit board having mounted thereon at least one of an integrated circuit, which is a heat-generating electronic component, a power supply device, and a heat sink having a fin that dissipates heat generated by the electronic component.

Furthermore, the technology disclosed in the present invention may also be used for a communication device, such as a switchboard, a router, a LAN switch, or the like. Furthermore, the technology disclosed in the present invention may also be used for a personal computer having mounted thereon a motherboard. Accordingly, the present invention is not limited to the embodiments described below.

[a] Example of a First Embodiment

Figure 1A:
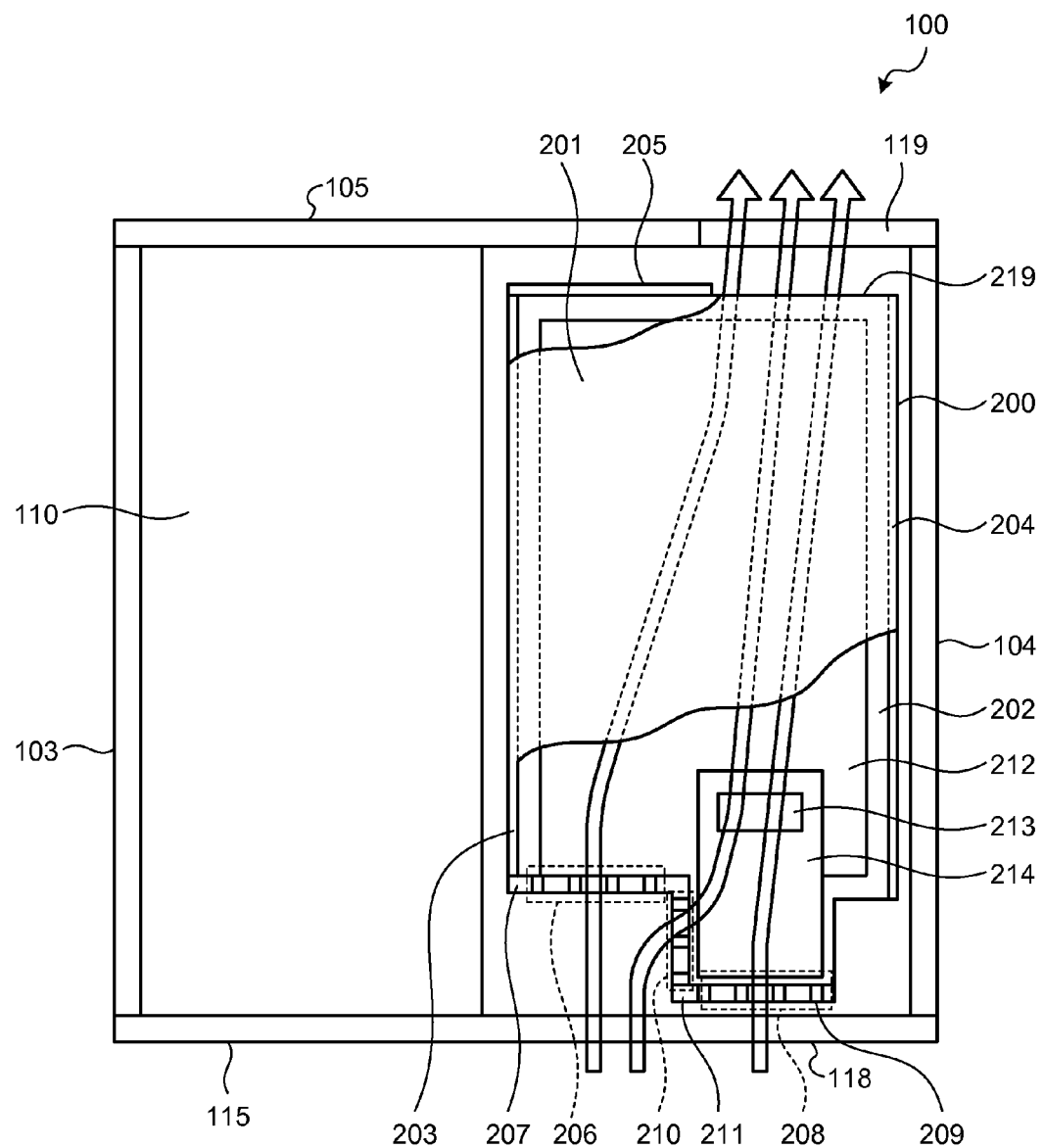
FIG. 1A is a sectional view of a rack of an electronic device according to an example of a first embodiment.
Figure 1B:
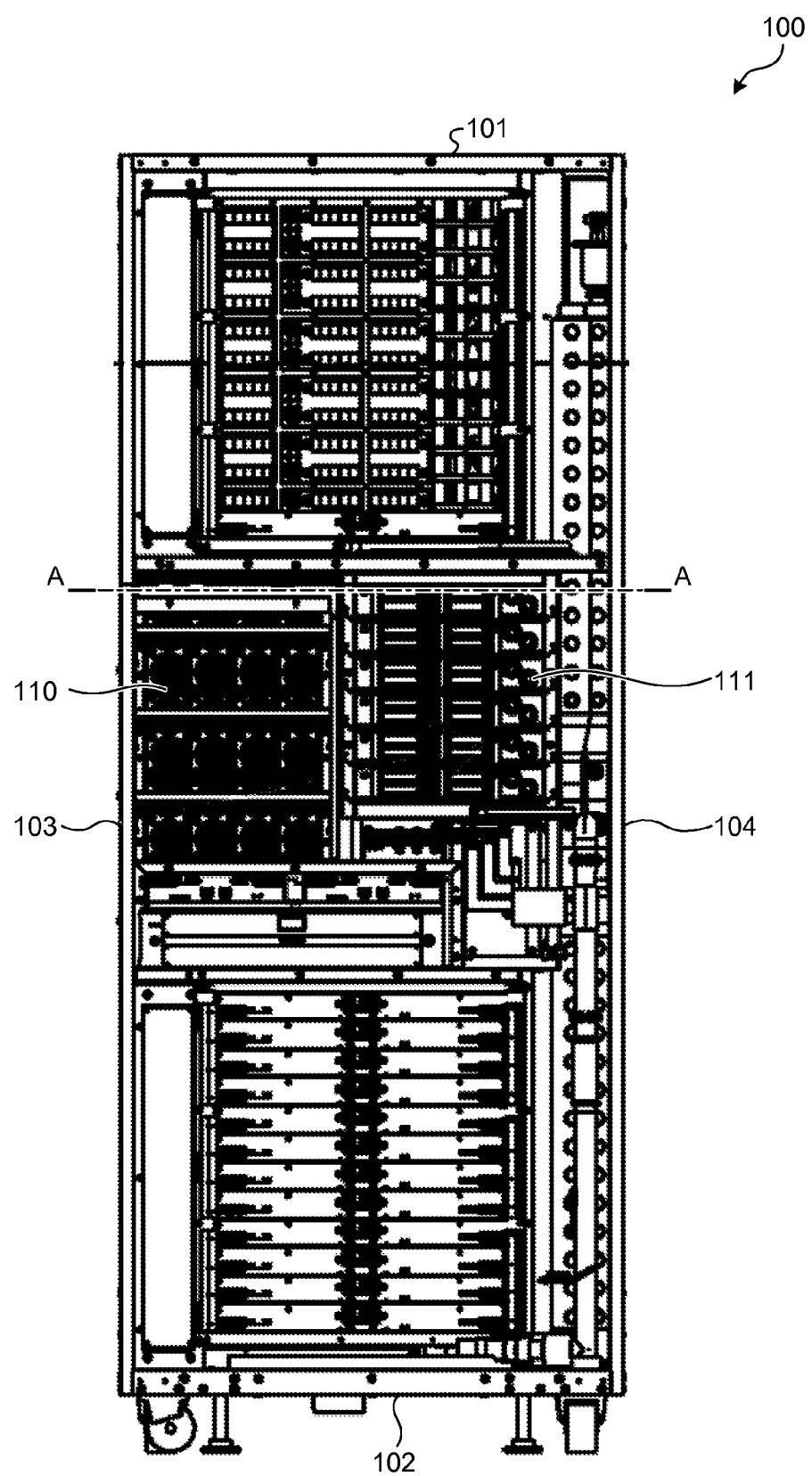
FIG. 1B is the sectional view of the rack of the electronic device, which is horizontally arranged illustrated in FIG. 1A.

FIG. 1A is a sectional view of a rack of an electronic device according to an example of a first embodiment. FIG. 1B is the sectional view of the rack of the electronic device, which is horizontally arranged, illustrated in FIG. 1A. FIG. 1B is a front view of a rack 100 of the electronic device according to an example of the first embodiment.

(Configuration of a Rack According to an Example of the First Embodiment)

In FIG. 1B, the rack 100 includes a top plate 101, a base plate 102, a side surface plate 103, a side surface plate 104, and a shelf 111. A power supply device 110 is arranged on the side of a first side surface plate of the shelf 111. FIG. 1B illustrates the state in which a front surface plate 115, which will be described later, that is an openable and closable door arranged on the front side of the rack 100 is opened; however, the front surface plate 115 is not illustrated. FIG. 1A is a sectional view of the rack 100 taken along horizontal direction line A-A in FIG. 1B. The rack 100 may also be formed from a sheet metal. Alternatively, the rack 100 may also be formed from a resin material.

As will be described later, the shelf 111 includes two guide panels 112-1 and 112-2 that each have the same number of combinations of guide rails that are arranged in parallel. The guide panels 112-1 and 112-2 are arranged such that the positions of a bottom surface, a top surface, and a horizontal surface of each of the guide rails are the same and such that the guide rails are perpendicular to the base plate 102, thereby the guide rails face each other.

By arranging an IO system board 200 on each of multiple guide rails facing each other, multiple IO system boards 200 are arranged on the shelf 111 in a layered manner. The sectional view, illustrated in FIG. 1A, of the rack 100 taken along line A-A in FIG. 1B is a schematic diagram illustrating, in an exposed manner, the top layer of the IO system board 200 arranged on the shelf 111.

Because the multiple IO system boards 200 are arranged on the shelf 111 in a layered manner, a sectional view taken along any line is the same as that illustrated in FIG. 1A as long as the line is parallel to line A-A in FIG. 1B and the line divides the shelf 111 such that the IO system boards 200 are exposed.

As illustrated in FIG. 1A, the rack 100 includes the front surface plate 115 that has an air intake port on an air intake surface 118; an air discharge face 119 that has an air discharge port; and a back surface plate 105 arranged opposite the front surface plate 115. Furthermore, the rack 100 also includes the side surface plate 103 arranged perpendicular to the base plate 102 and a second side surface plate arranged opposite the side surface plate 103.

The front surface plate 115, the back surface plate 105, the side surface plate 103, and the second side surface plate are arranged perpendicular to the base plate 102 of the rack 100. Specifically, in the rack 100, the top plate 101, the base plate 102, the side surface plate 103, the side surface plate 104, the front surface plate 115, and the back surface plate 105 are arranged to form a cuboidal shape.

(The IO System Boards According to an Example of the First Embodiment)

The IO system boards 200 are arranged adjacent to the power supply device 110 in the rack 100 surrounded by the front surface plate 115, the back surface plate 105, the side surface plate 103, and the second side surface plate. However, the TO system boards 200 are not always arranged adjacent to the power supply device 110. For example, the IO system boards 200 may also be arranged any position in the rack 100.

Each of the IO system boards 200 includes a top plate 201 and a base plate 202 that are arranged parallel to the top plate 101 and the base plate 102 of the rack 100, respectively, and includes a first side surface plate 203 that is arranged perpendicular to the top plate 201 and the base plate 202. Furthermore, each of the TO system boards 200 also includes a second side surface plate 204 that is arranged perpendicular to the top plate 201 and the base plate 202 and that opposes the first side surface plate 203.

Furthermore, each of the IO system boards 200 includes a back surface plate 205 that is arranged perpendicular to both the top plate 201 and the base plate 202 and includes a first section board 207 that is arranged opposite the back surface plate 205 and that has first ventilating holes 206. Furthermore, each of the IO system boards 200 includes a second section board 209 that is arranged parallel to the first section board 207, that is arranged by being shifted forward in the direction of the front surface plate 115 of the rack 100, and that has second ventilating holes 208.

Furthermore, each of the IO system boards 200 includes a third section board 211 that is arranged among the top plate 201, the base plate 202, the first section board 207, and the second section board 209; that is arranged parallel to the first side surface plate 203; and that has third ventilating holes 210.

Furthermore, a main circuit board 212 is arranged on each of the IO system boards 200 in the casing that is formed by the top plate 201, the base plate 202, the back surface plate 205, the first section board 207, the second section board 209, and the third section board 211. The main circuit board 212 is referred to as a motherboard. Heat-generating electronic components are mounted on the main circuit board 212. The casing of the IO system boards 200 may also be formed from a sheet metal, or alternatively, it may also be formed from a resin material.

Furthermore, each of the IO system boards 200 includes a first heat-generating component 213 in the casing of the TO system board 200 and includes a first sub circuit board 214 at a position bounded by the second section board 209 and the third section board 211. The heat-generating component mentioned here is, for example, an electronic component that generates heat due to its operation. Alternatively, there may also be a heat-dissipating component, such as a heat sink, having a fin that dissipates heat generated by the electronic components. The first sub circuit board 214 is connected to a riser card (not illustrated) that is arranged perpendicular to the main circuit board 212 such that the first sub circuit board 214 is parallel to the main circuit board 212.

Although a part of the top plate 201 is not illustrated, FIG. 1A illustrates the base plate 202, the first section board 207, the second section board 209, the third section board 211, the main circuit board 212, the first heat-generating component 213, and the first sub circuit board 214. The top plate 201 is arranged to cover an opening that is bounded by the back surface plate 205, the first section board 207, the second section board 209, and the third section board 211 and that is arranged opposite the base plate 202.

Furthermore, as illustrated in FIG. 1A, an air discharge face 219, which discharges cooling air flowing over the main circuit board 212 and the first sub circuit board 214 from the air discharge face 119 on the rack 100, is arranged on the same surface in which the back surface plate 205 is arranged.

(Example of an Advantage of the First Embodiment)

In addition to the first section board 207 that has the first ventilating holes 206 and the second section board 209 that has the second ventilating holes 208, the IO system boards 200 according to the first embodiment further includes the third section board 211 that has the third ventilating holes 210. Accordingly, a larger amount of cooling air is taken in via the air intake surface 118 of the rack 100 of the electronic device, flows into the casing of the IO system boards 200, and then flows over the first sub circuit boards 214, thus cooling the first heat-generating components 213.

[b] Example of a Second Embodiment (Configuration of a Rack of the Electronic Device According to the Example of the Second Embodiment)

Figure 2A:
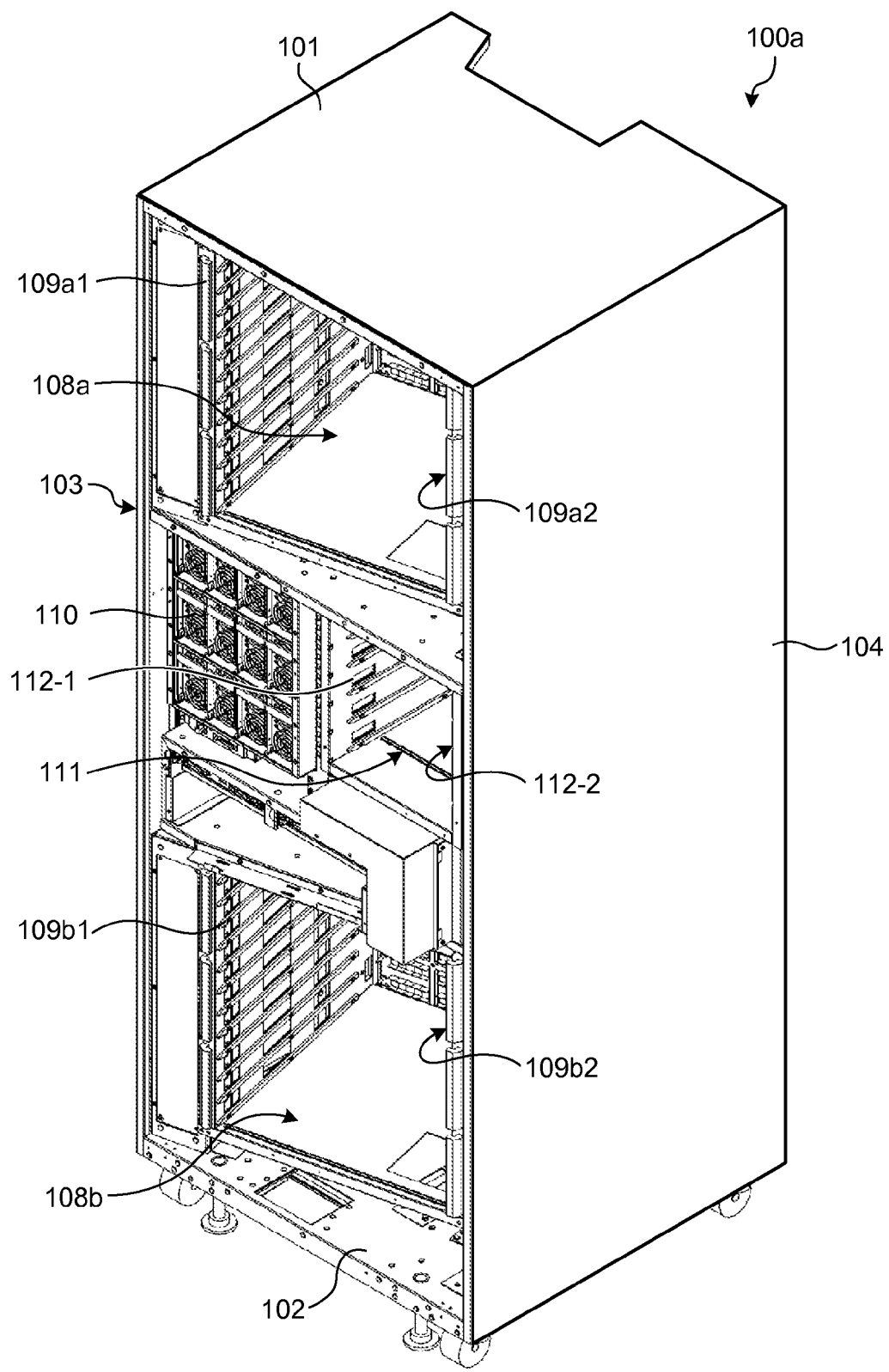
FIG. 2A is a perspective view, from the front, of the rack of the electronic device according to an example of the second embodiment.
Figure 2B:
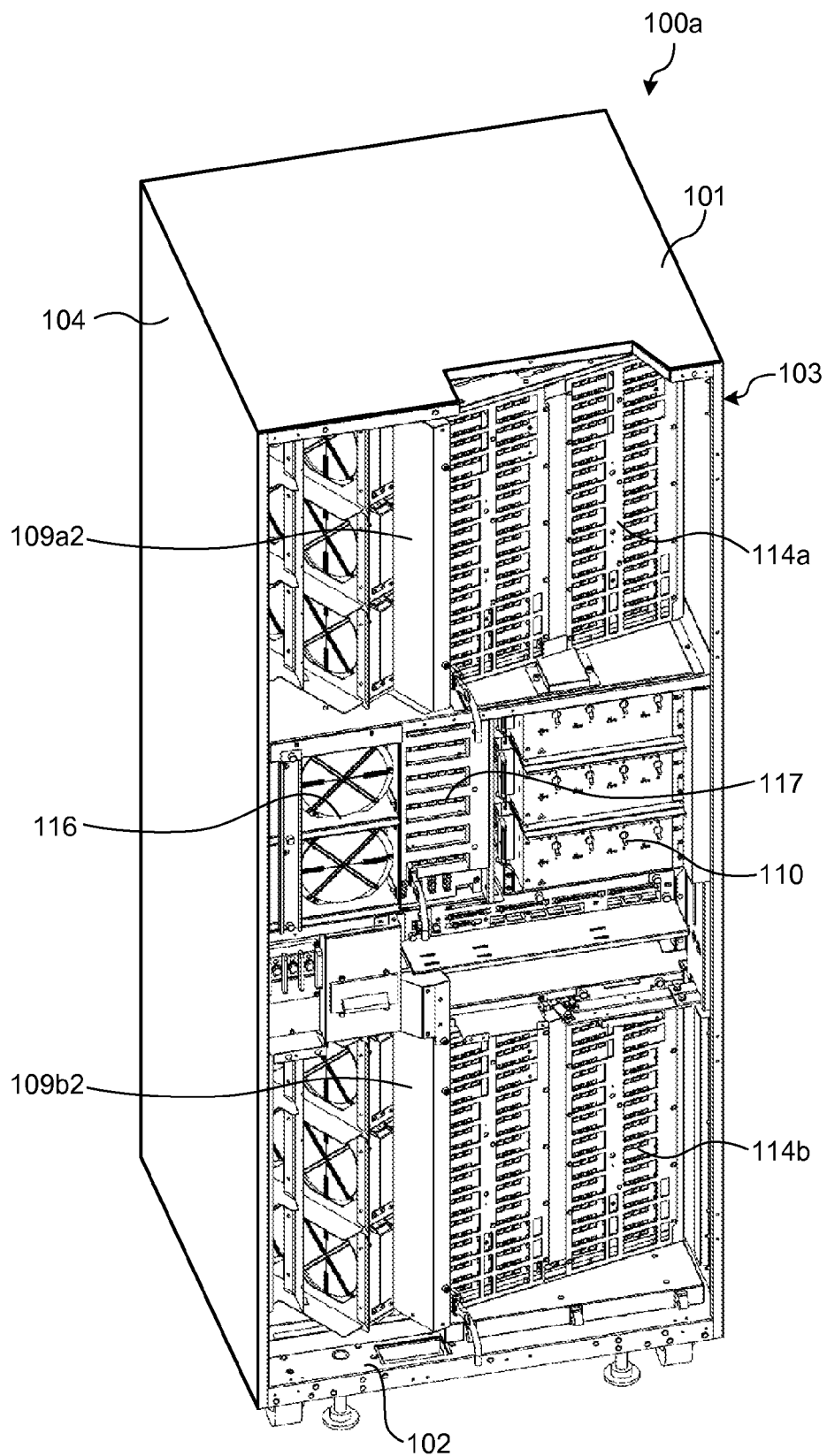
FIG. 2B is a perspective view, from the back, of the rack of the electronic device according to an example of the second embodiment.

FIG. 2A is a perspective view, from the front, of the rack of the electronic device according to an example of a second embodiment. FIG. 2B is a perspective view, from the back, of the rack of the electronic device according to an example of the second embodiment. In the example of the second embodiment, elements that have the same configuration as those in the first embodiment are assigned the same reference numerals.

FIG. 2A illustrates a rack 100a according to an example of the second embodiment in the state in which the front surface plate 115 that is an openable and closable door arranged on the front side of the rack 100a is opened; however the front surface plate 115 is not illustrated. Furthermore, in FIG. 2B, the back surface plate 105 included in the rack 100a is not illustrated.

As illustrated in FIGS. 2A and 2B, the rack 100a of the electronic device according to the example of the second embodiment includes the top plate 101, the base plate 102, the side surface plate 103, the side surface plate 104, a shelf 108a, a shelf 108b, and the shelf 111.

The base plate 102 is arranged parallel to the arrangement surface of the rack 100a. The side surface plate 103 and the side surface plate 104 are arranged perpendicular to the base plate 102. The top plate 101 is arranged perpendicular to the side surface plate 103 and the side surface plate 104.

Furthermore, the rack 100a includes the front surface plate 115 (not illustrated) and the back surface plate 105 (not illustrated) that is arranged opposite the front surface plate 115. The front surface plate 115 is an openable and closable door that is arranged to cover the rectangular opening, which is formed on the front side of the rack 100a and is formed by the top plate 101, the base plate 102, the side surface plate 103, and the side surface plate 104.

The back surface plate 105 is a member that is arranged to cover the rectangular opening, which is formed on the back surface of the rack 100a and is formed by the top plate 101, the base plate 102, the side surface plate 103, and the side surface plate 104.

(Front Perspective View of the Rack of the Electronic Device According to an Example of the Second Embodiment)

In the following, a description will be given with reference to FIG. 2A. The rack 100a includes the shelf 108a and the shelf 108b in a space that is bounded by the side surface plate 103 and the side surface plate 104. System boards, which are arranged in the blade-shaped casing, are arranged on each of the shelf 108a and the shelf 108b.

The shelf 108a includes a guide panel 109a1 and a guide panel 109a2 (not illustrated) that each have the same number of combinations of guide rails that are arranged in parallel. The shelf 108b includes a guide panel 109b1 and a guide panel 109b2 (not illustrated) that each have the same number of combinations of guide rails that are arranged in parallel.

The guide panel 109a1 and the guide panel 109a2 are arranged such that the positions of a bottom surface of the guide panel and a horizontal position of each of the guide rails are the same and such that the guide rails are arranged perpendicular to the base plate 102, thereby the guide rails face each other. The guide panel 109b1 and the guide panel 109b2 are arranged in the same manner as the guide panel 109a1 and the guide panel 109a2.

Then, the power supply device 110 and the shelf 111 are arranged side by side between the shelf 108a and the shelf 108b, i.e., in the vertical direction of the rack 100a. The power supply device 110 is arranged on the side surface plate 103 side, whereas the shelf 111 is arranged on the side surface plate 104 side.

The power supply device 110 controls the power supply supplied to the electronic device, arranged in the rack 100a, in which electronic components are mounted on the system board and an TO system board 200a, which will be described later. Each of the TO system boards 200a that are used by an electronic device in order to transmit and receive data to/from an external unit is arranged on the shelf 111.

The shelf 111 includes the guide panel 112-1 and the guide panel 112-2 (not illustrated) that each have the same number of combinations of guide rails that are arranged in parallel. The guide panel 112-1 and the guide panel 112-2 are arranged such that the positions of a bottom surface of the guide panel and a horizontal surface of each of the guide rails are the same and such that the guide rails are arranged perpendicular to the base plate 102, thereby the guide rails face each other.

Then, the guide panel 112-1 and the guide panel 112-2 are arranged on the shelf 111 in the rack 100a. By arranging IO system boards 200a, which will be described later, on the multiple guide rails that face each other, it is possible to arrange multiple IO system boards 200a on the shelf 111 in a layered manner.

(Back Surface Perspective View of the Rack of the Electronic Device According to an Example of the Second Embodiment)

In the following, a description will be given with reference to FIG. 2B. In the rack 100a, a connecting circuit board 114a referred to as a back plane is arranged on the back surface of the shelf 108a. The connecting circuit board 114a is arranged perpendicular to the guide panel 109a1 and the guide panel 109a2. Furthermore, on the back surface of the shelf 108a, the connecting circuit board 114a is arranged to cover the rectangular opening that is formed using the guide panel 109a1 and the guide panel 109a2.

The connecting circuit board 114a electrically connects multiple system boards arranged on the shelf 108a. By connecting multiple connecting terminals of the system boards arranged on the back surface of the casing for the system boards to the connecting circuit board 114a, the multiple system boards are electrically connected.

Similarly, in the rack 100a, a connecting circuit board 114b referred to as a back plane is arranged on the back surface of the shelf 108b. The connecting circuit board 114b is arranged perpendicular to the guide panel 109b1 and the guide panel 109b2.

Furthermore, on the back surface of the shelf 108a, the connecting circuit board 114b is arranged to cover the rectangular opening formed using the guide panel 109b1 and the guide panel 109b2. In a similar manner to the connecting circuit board 114a, the connecting circuit board 114b electrically connects the system boards arranged on the shelf 108b.

Furthermore, on the back surface of the shelf 111 in the rack 100a, a cooling device 116 and a connecting circuit board 117 are arranged side by side. The cooling device 116 cools multiple electronic components mounted on the IO system boards 200a that are arranged on the shelf 111. The connecting circuit board 117 is a back plane that electrically connects the main circuit boards 212 that are arranged on the multiple IO system boards 200a on the shelf 111 in the casing. The power supply device 110 is arranged between the connecting circuit board 117 and the side surface plate 103.

(IO System Board According to an Example of the Second Embodiment)

Figure 3A:
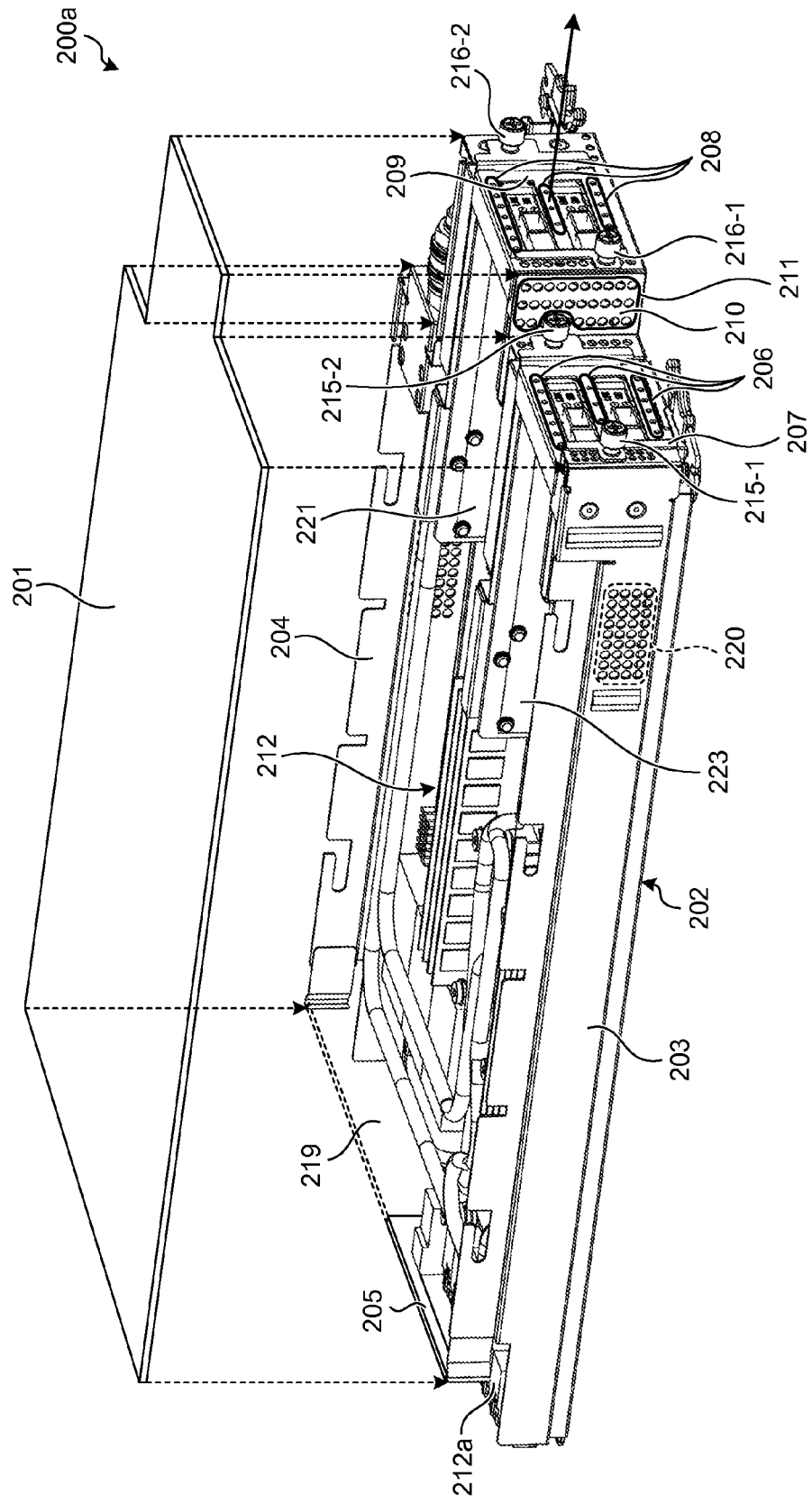
FIG. 3A is a perspective view of an IO system board according to an example of a second embodiment.

FIG. 3A is a perspective view of an IO system board according to an example of a second embodiment. FIG. 3A illustrates the state in which the inside of the casing of the IO system board 200a according to an example of the second embodiment may be seen by removing the top plate 201 from the IO system board 200a.

As illustrated in FIG. 3A, the IO system board 200a includes the base plate 202, the first side surface plate 203 that is arranged perpendicular to the base plate 202, and the second side surface plate 204 that is arranged perpendicular to the base plate 202 and is arranged opposite the first side surface plate 203.

Furthermore, the IO system board 200a includes the back surface plate 205 that is arranged perpendicular to the base plate 202 and the first section board 207 that is arranged opposite the back surface plate 205 and that has the first ventilating holes 206. The IO system board 200a includes the second section board 209 that has the second ventilating holes 208 that is arranged parallel to the first section board 207 by being shifted forward with respect to the first section board 207 in the direction indicated by the solid-line arrow. A port to each of which a cable is connected is arranged on each of the first section board 207 and the second section board 209. Examples of the cable include an interface bus (IB) cable, an IO cable, and a local area network (LAN) cable.

Furthermore, among the base plate 202, the first section board 207, and the second section board 209, the IO system board 200a includes the third section board 211 that has the third ventilating holes 210 and that is arranged parallel to the first side surface plate 203. The first side surface plate 203 has the fourth ventilating holes 220 in the vicinity of the first section board 207.

The top plate 201 is arranged on the IO system board 200a in the direction indicated by the broken-line arrow. The top plate 201 is arranged to cover an opening, which forms a plane formed by the first side surface plate 203, the second side surface plate 204, the back surface plate 205, the first section board 207, the second section board 209, and the third section board 211, and that faces the base plate 202.

Hereinafter, the cube formed by components including the top plate 201, the base plate 202, the first side surface plate 203, the second side surface plate 204, the back surface plate 205, the first section board 207, the second section board 209, and the third section board 211 is referred to as a casing of the IO system board 200a. The main circuit board 212 is arranged on the base plate 202 in the casing of the IO system board 200a. Electronic components are mounted on the main circuit board 212. The main circuit board 212 has a connecting terminal 212a that is exposed, outside the casing, from the back surface plate 205.

In the casing of the IO system board 200a, in order to arrange a sub circuit board at the position bounded by the first section board 207 and the first side surface plate 203, a riser card 223 having mounted thereon the subject sub circuit board is arranged perpendicular to the main circuit board 212. The subject sub circuit board is arranged perpendicular to the riser card 223 such that the subject sub circuit board is parallel to the main circuit board 212.

Similarly, in the casing of the IO system board 200a, in order to arrange a sub circuit board at the position bounded by the second section board 209 and the third section board 211, a riser card 221 having mounted thereon the subject sub circuit board is arranged perpendicular to the main circuit board 212. The subject sub circuit board is arranged perpendicular to the riser card 221 such that the subject sub circuit board is parallel to the main circuit board 212.

A port, to which a cable arranged each of the first section board 207 and the second section board 209 is connected, is arranged on each of the sub circuit boards mounted on the riser card 223 and the riser card 221. A port associated with the subject sub circuit board is exposed at either one of the associated first section board 207 and the second section board 209.

(Arrangement of the Sub Circuit Board on the IO System Board According to an Example of the Second Embodiment)

Figure 3B:
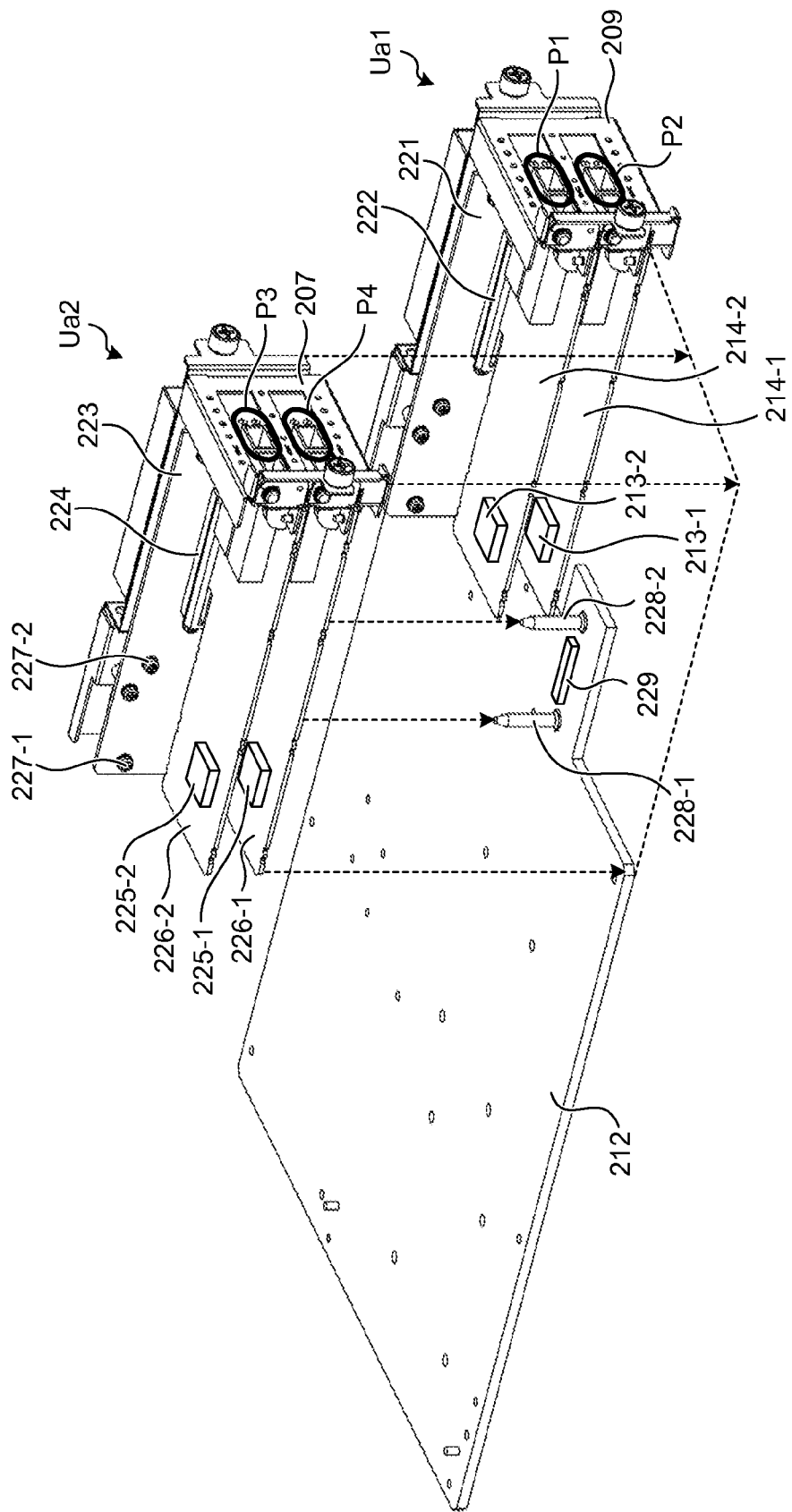
FIG. 3B is a schematic diagram illustrating the outline of a sub circuit board that is arranged on the IO system board according to an example of the second embodiment.

FIG. 3B is a schematic diagram illustrating the outline of a sub circuit board that is arranged on the IO system board according to an example of the second embodiment. Sub circuit boards 214-1 and 214-2 are arranged perpendicular to the riser card 221, which is arranged perpendicular to the main circuit board 212, and are arranged parallel to the main circuit board 212.

The sub circuit board 214-2 having mounted thereon a heat-generating component 213-2 is electrically connected to the riser card 221 by inserting a connecting terminal to a connector 222 included in the riser card 221. The sub circuit board 214-1 having mounted thereon a heat-generating component 213-1 is also electrically connected to the riser card 221 by inserting a connecting terminal to a connecting socket (not illustrated) included in the riser card 221.

The sub circuit board 214-1 includes a port P2 to which a cable is connected. The sub circuit board 214-1 is mounted on the riser card 221 such that the port P2 is exposed from a hole arranged on the second section board 209. Similarly, the sub circuit board 214-2 includes the port P1 to which a cable is connected. The sub circuit board 214-2 is mounted on the riser card 221 such that a port P1 is exposed from a hole arranged on the second section board 209. Hereinafter, a unit formed by components including the riser card 221, the sub circuit board 214-1, the sub circuit board 214-2, and the second section board 209 is referred to as a riser unit Ua1.

Furthermore, sub circuit boards 226-1 and 226-2 are arranged perpendicular to the riser card 223, which is arranged perpendicular to the main circuit board 212, and are arranged parallel to the main circuit board 212.

The sub circuit board 226-2 having mounted thereon a heat-generating component 225-2 is electrically connected to the riser card 223 by inserting a connecting terminal to a connector 224 included in the riser card 223. The sub circuit board 226-1 having mounted thereon a heat-generating component 225-1 is also electrically connected to the riser card 223 by inserting a connecting terminal to a connecting socket (not illustrated) included in the riser card 223.

The sub circuit board 226-1 includes a port P4 to which a cable is connected. The sub circuit board 226-1 is mounted on the riser card 223 such that the port P4 is exposed from a hole arranged on the first section board 207. Similarly, the sub circuit board 226-2 includes a port P3 to which a cable is connected. The sub circuit board 226-2 is mounted on the riser card 223 such that the port P3 is exposed from a hole arranged on the first section board 207. Hereinafter, a unit formed by components including the riser card 223, the sub circuit board 226-1, the sub circuit board 226-2, and the first section board 207 is referred to as a riser unit Ua2.

The riser unit Ua2 is electrically connected to the main circuit board 212 by inserting a connecting terminal (not illustrated), which is connected to the main circuit board 212 included in the riser card 223, to a connector 229 arranged on the main circuit board 212. The connector 229 is arranged between a guide pin 228-1 and a guide pin 228-2 arranged on the main circuit board 212.

The riser unit Ua2 is fixed on the main circuit board 212 in the direction indicated by the arrow illustrated in FIG. 3B. The riser card 223 includes a clamp formed from a screw 227-1, a screw 227-2, and a clamp band (not illustrated) in combination. The clamp band (not illustrated) is arranged, on a surface in which the connector 224 of the riser card 223 is not arranged, at a position in which the screw 227-1 and the screw 227-2 are fixed. The screws are typically fastening members.

However, the clamping member is not limited to screws. For example, the fastening member may also be a pushpin that has a retaining structure and that is formed from a resin material or a metal material.

When the connecting terminal for the riser card 223 is inserted into the connector 229, a peripheral portion of the tip of the guide pin 228-1 and the guide pin 228-2 is fixed by the clamp formed from the screw 227-1, the screw 227-2, and the clamp band in combination. In this way, the riser unit Ua2 is fixed to the main circuit board 212. Similarly to the riser unit Ua2, the riser unit Ua1 is fixed to the main circuit board 212.

(Main Circuit Board on the IO System Board According to an Example of the Second Embodiment)

Figure 4:
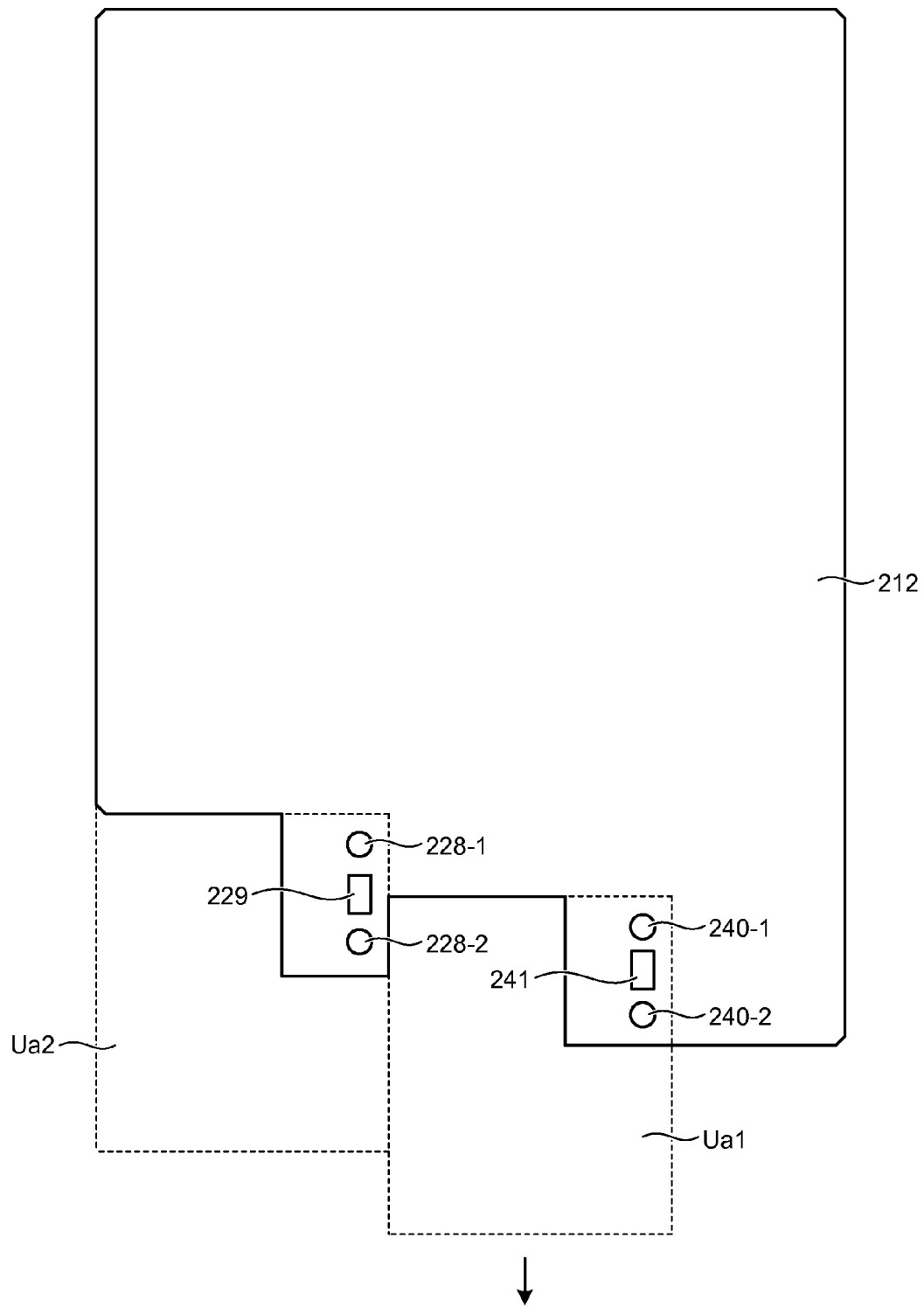
FIG. 4 is a schematic diagram illustrating a main circuit board of the IO system board according to an example of the second embodiment.

FIG. 4 is a schematic diagram illustrating a main circuit board of the IO system board according to an example of the second embodiment. As illustrated in FIG. 4, the main circuit board 212 is a plate-shaped member that includes notches having a shape according to the position in which the riser unit Ua1 or the riser unit Ua2 is fixed.

As indicated by the broken line in FIG. 4, the riser unit Ua1 and the riser unit Ua2 are arranged on the main circuit board 212 such that the riser unit Ua1 is shifted forward in the direction indicated by the arrow in FIG. 4 with respect to the riser unit Ua2. The main circuit board 212 is arranged such that the arrangement position of a guide pin 240-1, a guide pin 240-2, and a connector 241, to which the riser unit Ua1 is fixed, is shifted forward in the direction indicated by the arrow in FIG. 4 with respect to the arrangement position of the guide pin 228-1, the guide pin 228-2, and the connector 229, to which the riser unit Ua2 is fixed.

Parts of the guide pin 240-1, the guide pin 240-2, and the connector 241 are the same as those of the guide pin 228-1, the guide pin 228-2, and the connector 229 in the second embodiment; however, they may also be different parts.

(Top View of the IO System Board According to an Example of the Second Embodiment)

Figure 5A:
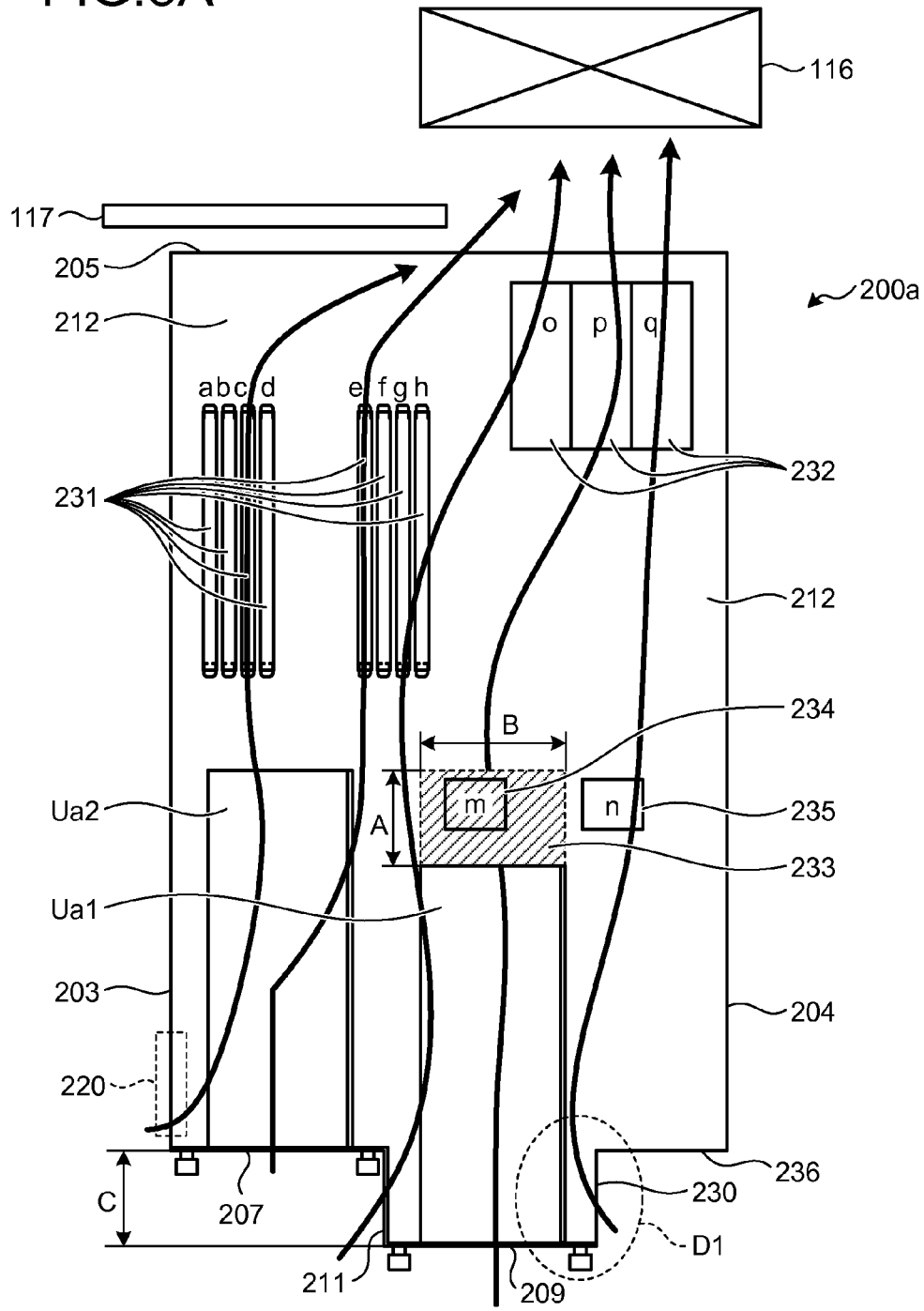
FIG. 5A is a top view of the IO system board according to an example of the second embodiment.

FIG. 5A is a top view of the IO system board according to an example of the second embodiment. As illustrated in FIG. 5A, the riser unit Ua1 and the riser unit Ua2, which is shifted forward with respect to the riser unit Ua1 by the distance of "C" illustrated in FIG. 5A, are arranged on the main circuit board 212 on the IO system board 200a according to an example of the second embodiment.

On the IO system board 200a, the first side surface plate 203 that has the fourth ventilating holes 220 and the second side surface plate 204 that is arranged opposite the first side surface plate 203 and that is arranged perpendicular to the main circuit board 212 are arranged.

Furthermore, on the IO system board 200a, a fourth section board 230 is arranged such that the fourth section board 230 faces the third section board 211. A fifth section board 236 is arranged between the fourth section board 230 and the second side surface plate 204 such that the fifth section board 236 is perpendicular to the main circuit board 212. The structure, in detail, of peripheral portion D1 if the fourth section board 230 will be described later with reference to FIG. 5C.

Furthermore, on the IO system board 200a, the back surface plate 205 is arranged perpendicular to the main circuit board 212. The connecting circuit board 117 is arranged in the vicinity of the back surface plate 205 and arranged out of the region of the main circuit board 212. Furthermore, on the IO system board 200a, the cooling device 116 is arranged such that an air intake surface is perpendicular to the main circuit board 212. The cooling device 116 is arranged away from the position of the back surface plate 205 of the main circuit board 212 by the distance of about 40 mm.

By making the riser unit Ua1 shift forward by the distance of "C", a rectangular mounting area 233 having the length of each side of "A" and "B" illustrated in FIG. 5A is created on the main circuit board 212. An electronic component 234 may also be mounted on the mounting area 233 of the main circuit board 212. An electronic component 235 is arranged on the second side surface plate 204 side of the electronic component 234.

If the electronic component 234 is an electronic component that is connected to the riser unit Ua1 and/or the riser unit Ua2, it is possible to reduce the wiring distance to the riser unit Ua1 and/or the riser unit Ua2 by mounting the electronic component 234 on the mounting area 233.

Electronic components 231 ("a" to "h") are mounted on the main circuit board 212. Furthermore, electronic components 232 ("o" to "q") are mounted on the main circuit board 212. The cooling device 116 is arranged in the vicinity of the electronic components 232 ("o" to "q") and arranged out of the region of the main circuit board 212.

As illustrated in FIG. 5A, cooling air flows into the casing of the IO system board 200a from the ventilating holes 220 included in the first side surface plate 203, from the ventilating holes included in the first section board 207, and from the ventilating holes included in the second section board 209. The cooling air flowing from the ventilating holes 220 flows into the casing of the IO system board 200a via the space bounded by the first side surface plate 203 and a guide panel 112-1 of the shelf 111.

Furthermore, the cooling air flows into the casing of the IO system board 200a from ventilating holes included in the third section board 211 and the fourth section board 230. Accordingly, because the cooling air flows into the casing of the IO system board 200a from a lot of ventilating holes, it is possible to efficiently cool the electronic components 231, 232, 234, and 235.

(Front View of the IO System Board According to an Example of the Second Embodiment)

Figure 5B:
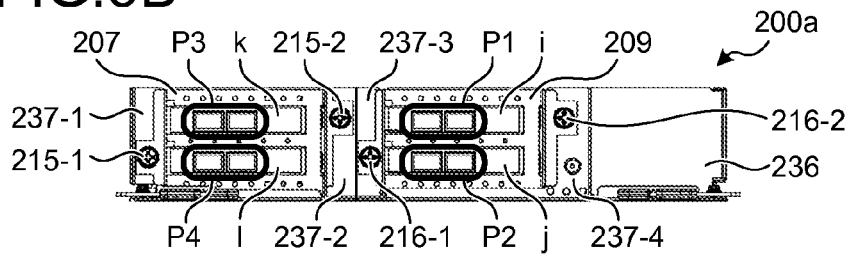
FIG. 5B is a front view of the IO system board according to the example of the second embodiment.

FIG. 5B is a front view of the IO system board according to the example of the second embodiment. FIG. 5B illustrates the IO system board 200a according to an example of the second embodiment viewed from the direction of the first section board 207 and the second section board 209.

As illustrated in FIG. 5B, the first section board 207 is secured to the IO system board 200a by engaging a screw 215-1 and a screw 215-2 with screw holes of a section board 237-1 and a section board 237-2, respectively. The section board 237-1 and the section board 237-2 are members of the casing of the IO system board 200a arranged perpendicular to the main circuit board 212.

Furthermore, as illustrated in FIG. 5B, the second section board 209 is secured to the IO system board 200a by engaging a screw 216-1 and a screw 216-2 with screw holes of a section board 237-3 and a section board 237-4, respectively.

The section board 237-3 and the section board 237-4, which are members of the casing of the IO system board 200a, are arranged perpendicular to the main circuit board 212 and are arranged such that, similarly to the second section board 209, the section board 237-3 and the section board 237-4 is shifted forward with respect to the first section board 207. In FIG. 5B, the fifth section board 236 is located opposite a position where the first section board 207 is secured with the second section board 209 therebetween.

In FIG. 5B, a member that is used to secure the port P1 to the second section board 209 is represented by symbol "i", a member that is used to secure the port P2 to the second section board 209 is represented by symbol "j", a member that is used to secure the port P3 to the first section board 207 is represented by symbol "k", and a member that is used to secure the port P4 to the first section board 207 is represented by symbol "l".

(Details of a Peripheral Portion D1 of the Fourth Section Board 230)

FIG. 5C is a detailed diagram illustrating a portion of the IO system board according to an example of the second embodiment. FIG. 5C illustrates, in detail, the peripheral portion D1 of the fourth section board 230. As illustrated in FIG. 5C, vent holes 239 are arranged on the fourth section board 230. The section board 237-4 is arranged perpendicular to the fourth section board 230. The second section board 209 is secured to the section board 237-4 by engaging the screw 216-2 with a screw hole of the section board 237-4.

(Inflow Direction of the Cooling Air Over the IO System Board According to an Example of the Second Embodiment)

Figure 6A:
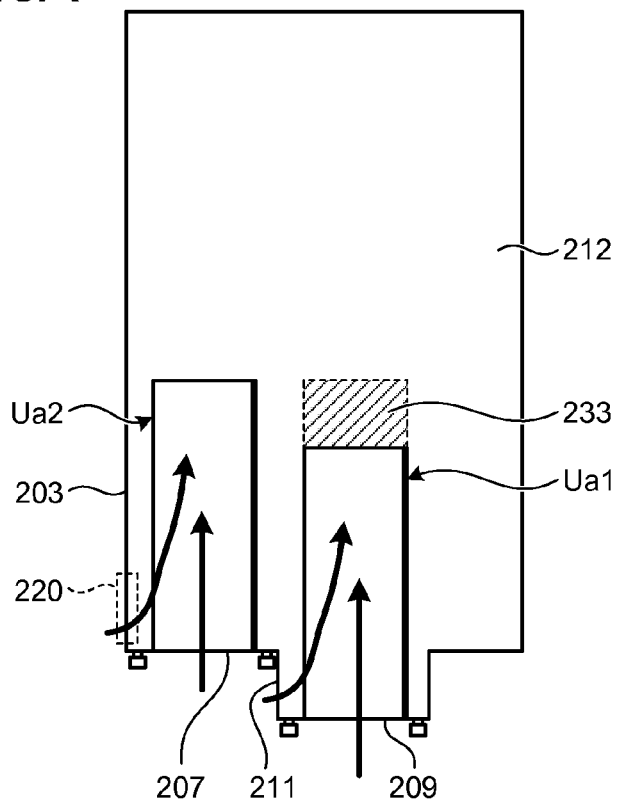
FIG. 6A is a schematic diagram illustrating the inflow direction of cooling air toward the IO system board according to an example of the second embodiment.

FIG. 6A is a schematic diagram illustrating the inflow direction of cooling air toward the IO system board according to an example of the second embodiment. As illustrated in FIG. 6A, the electronic components arranged on the sub circuit board on the riser unit Ua1 is cooled by the cooling air flowing from, in addition to the ventilating holes included in the second section board 209, the ventilating holes included in the third section board 211.

Furthermore, as illustrated in FIG. 6A, the electronic components arranged on the sub circuit board on the riser unit Ua2 is cooled by the cooling air flowing from, in addition to the ventilating holes included in the first section board 207, the ventilating holes 220 included in the first side surface plate 203. In this way, the electronic components mounted on each of the sub circuit boards on the riser unit Ua1 and the riser unit Ua2 are efficiently cooled by a larger amount of cooling air flowing from a larger number of ventilating holes.

Furthermore, because the mounting area 233 for the electronic components are created on the main circuit board 212 due to the arrangement of the riser unit Ua1 by shifting it with respect to the riser unit Ua2, a larger number of electronic components may be mounted on the main circuit board 212, thus implementing high-density mounting of electronic components. Alternatively, by moving some of the electronic components mounted on the main circuit board 212 to the mounting area 233, it is possible to reduce the amount of space needed for the main circuit board 212 and thus possible to reduce the size of the IO system board 200a.

(Connecting of the Cable to the IO System Board According to an Example of the Second Embodiment)

Figure 6B:
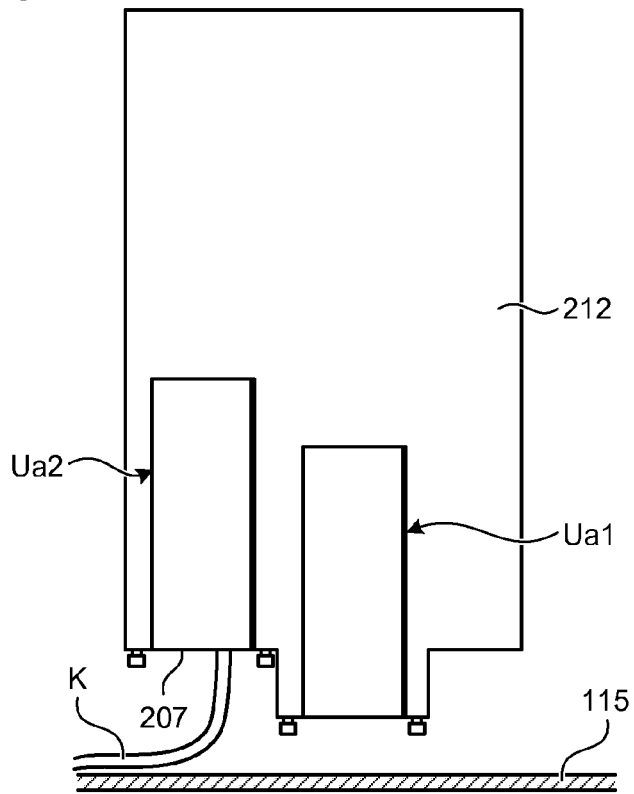
FIG. 6B is a schematic diagram illustrating a cable for connecting to the IO system board according to an example of the second embodiment.

FIG. 6B is a schematic diagram illustrating a cable for connecting to the IO system board according to an example of the second embodiment. FIG. 6B illustrates a case in which a cable K is connected to the port included in the riser unit Ua2.

As illustrated in FIG. 6B, the cable K, such as an IB cable, having a large bend radius is connected to the port of the riser unit Ua2 in which a cable space may be ensured. The cable space mentioned here indicates the space between the first section board 207 and the front surface plate 115 of the rack 100a of the electronic device. Accordingly, there is no need to increase the size of the rack 100a of the electronic devices, and thus the size of the rack 100a may be reduced. A cable, such as a LAN cable, having a small bend radius may be connected to the port included in the riser unit Ua1.

(Cooling State of the Electronic Components of the IO System Board According to an Example of the Second Embodiment)

Figure 7:
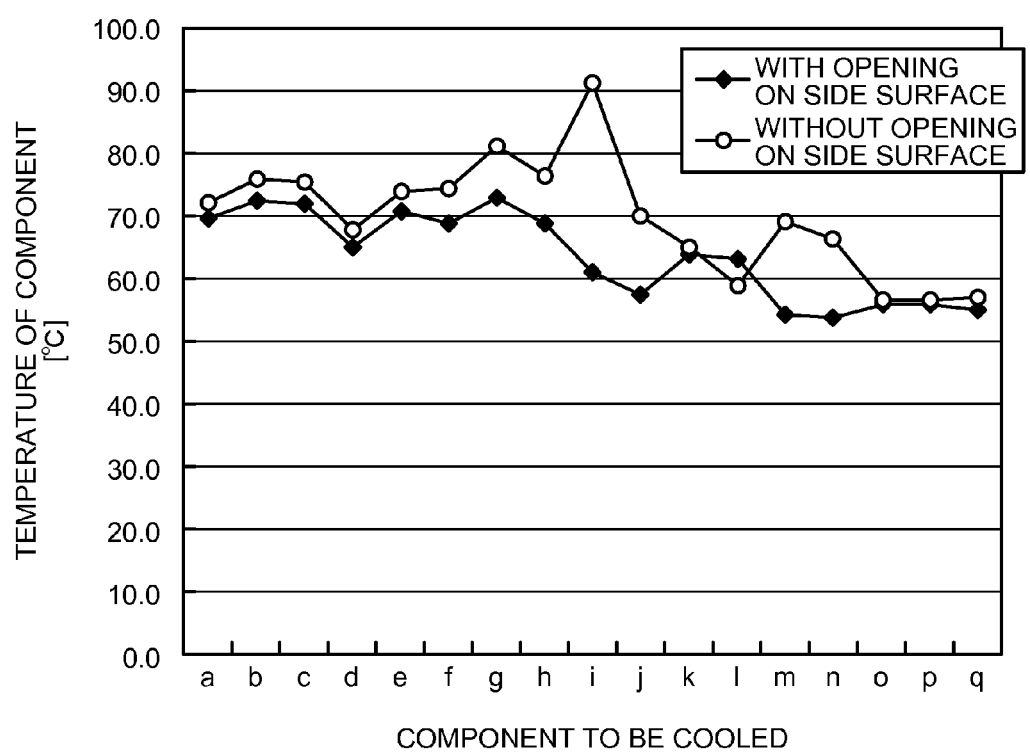
FIG. 7 is a schematic diagram illustrating the cooling states of electronic components mounted on the IO system board according to an example of the second embodiment.

FIG. 7 is a schematic diagram illustrating the cooling states of electronic components mounted on the IO system board according to an example of the second embodiment. Components represented by symbols "a to h", "m", "n", and "o to q" to be cooled indicated by the horizontal axis illustrated in FIG. 7 correspond to the electronic components 231 represented by symbols "a to h", the electronic component 234 represented by symbol "m", the electronic component 235 represented by symbol "n", and the electronic components 232 represented by symbols "o to q" illustrated in FIG. 5A, respectively.

Furthermore, the components represented by symbols "i to l" to be cooled indicated by the horizontal axis illustrated in FIG. 7 correspond to the members represented by symbols "i" and "j", which are used to secure the ports P1 and P2 illustrated in FIG. 5B to the second section board 209, and correspond to the members represented by symbols "k" and "1", which are used to secure the ports P3 to P4 illustrated in FIG. 5B to the first section board 207.

As illustrated in FIG. 7, when compared with a case of the IO system board 200a "without the opening on the side surface", in a case of the IO system board 200a "with the opening on the side surface", the temperatures of all of the components, except for the component represented by symbol "1", to be cooled are reduced. Specifically, in a case of the IO system board 200a "with the opening on the side surface", the temperatures of the riser unit Ua1 and the riser unit Ua2 are reduced, for example, by 13.6° C. on average when compared in a case of the IO system board 200a "without the opening on the side surface". Furthermore, in a case of the IO system board 200a "with the opening on the side surface", the temperatures of the electronic components 231, the electronic components 232, the electronic component 234, and the electronic component 235 are reduced, for example, by 4.5° C. on average when compared in a case of the IO system board 200a "without the opening on the side surface".

The description of "with the opening on the side surface" mentioned here indicates that ventilating holes 210 and the vent holes 239 are arranged on the third section board 211 and the fourth section board 230, respectively. The description of "without the opening on the side surface" mentioned here indicates the ventilating holes and the vent holes are not arranged on the third section board 211 and the fourth section board 230.

In a case of the IO system board 200a "with the opening on the side surface", the temperature of the component "1" to be cooled rises when compared in a case of the IO system board 200a "without the opening on the side surface". The reason for this is as follows. If ventilating holes are arranged on the third section board 211 and the fourth section board 230, although the total amount of cooling air flowing into the casing of the IO system board 200a increases, the amount of the cooling air flowing into the casing from the ventilating holes 220 that are the closest to the component "1" to be cooled is reduced.

(Advantage of an Example of the Second Embodiment)

The IO system board 200a according to the second embodiment further includes the third section board 211 that has the third ventilating holes 210, in addition to the first section board 207 that has the first ventilating holes 206 and the second section board 209 that has the second ventilating holes 208. Accordingly, the cooling air taken in via the air intake surface 118 of the rack 100a may efficiently cool the heat-generating components 213-1 to 213-2 and 225-1 to 225-2 by flowing over the sub circuit boards 214-1 to 214-2 and 226-1 to 226-2. Furthermore, the cooling air taken in via the air intake surface 118 of the rack 100 may further efficiently cool the electronic components 231, 232, 234, and 235 arranged on the main circuit board 212.

[c] Example of a Third Embodiment (IO System Board According to an Example of the Third Embodiment)

Figure 8:
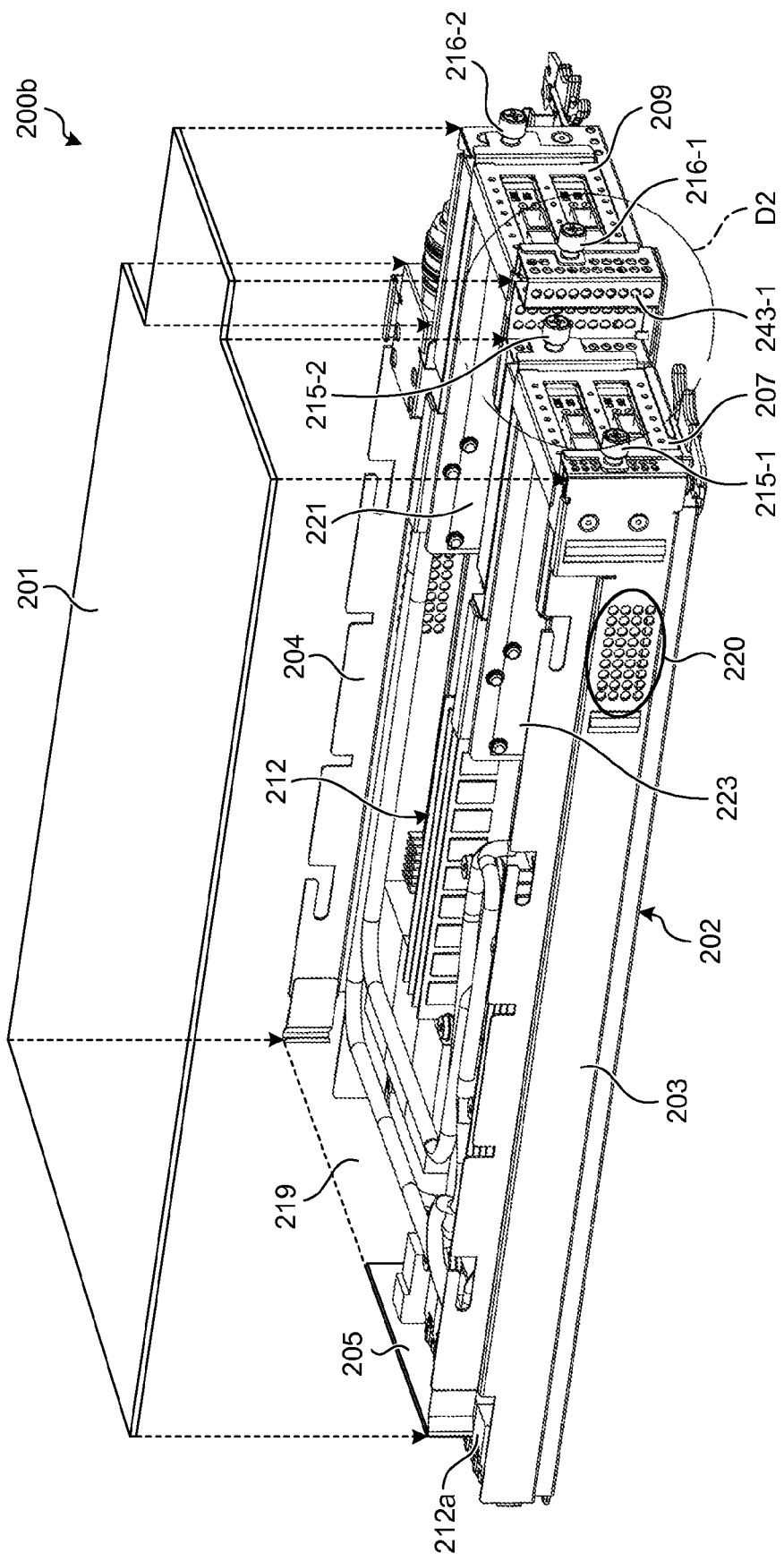
FIG. 8 is a perspective view of an IO system board according to an example of the third embodiment.

FIG. 8 is a perspective view of an IO system board according to an example of the third embodiment. FIG. 8 illustrates a state in which the inside of the casing of an IO system board 200b according to an example of the third embodiment may be seen by removing the top plate 201 from the IO system board 200b. In the example of the third embodiment, elements that have the same configuration as those in the second embodiment are assigned the same reference numerals.

The IO system board 200b includes a sheet metal member 243-1 instead of the third section board 211 when compared with a case of the IO system board 200a according to the example of the second embodiment. The sheet metal member 243-1 is formed from a sheet metal by bending the sheet metal such that at least two surfaces are in parallel or substantially in parallel. The structure, in detail, of the peripheral portion D2 of the sheet metal member 243-1 will be described with reference to FIGS. 9A and 9B.

(Details of a Peripheral Portion D2 of the Sheet Metal Member 243-1)

Figure 9A:
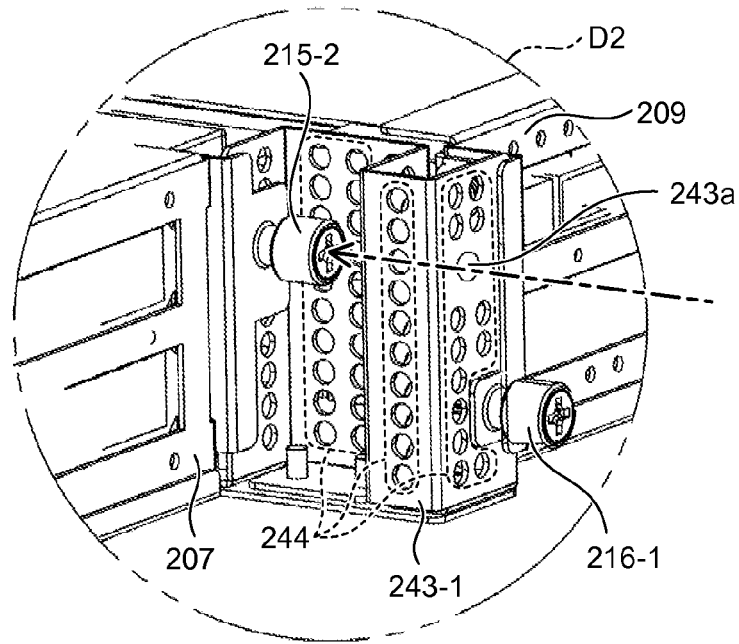
FIG. 9A is a detailed diagram illustrating a portion of the IO system board according to an example of the third embodiment.
Figure 9B:
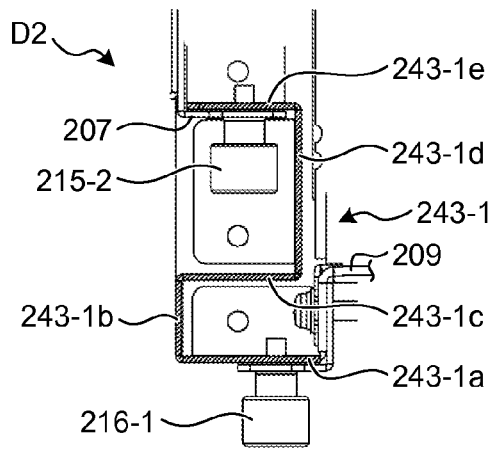
FIG. 9B is a detailed diagram illustrating, viewed from the top, a sheet metal member arranged on the IO system board according to an example of the third embodiment.

FIGS. 9A and 9B are detailed diagrams illustrating a portion of the IO system board according to an example of the third embodiment. FIG. 9A illustrates, in detail, the peripheral portion D2 of the sheet metal member 243-1. As illustrated in FIG. 9A, a vent hole 244 is arranged on the sheet metal member 243-1. The second section board 209 is fastened by the screw 216-1 and the first section board 207 is fastened by the screw 215-2, thereby they are fastened to the sheet metal member 243-1.

As illustrated in FIG. 9A, a through-hole 243a is arranged on the sheet metal member 243-1. By inserting the screw 215-2 into the through-hole 243a in the direction indicated by the arrow illustrated in FIG. 9A using a screwdriver and pressing the tip of the screwdriver against the head of the screw 215-2, it is possible to engage and disengage the screw 215-2. Alternatively, the engagement and disengagement of the screw 215-2 may also be performed by a person's finger by arranging an inner diameter of the through-hole 243a that is large enough to allow the person's finger to be inserted.

FIG. 9B is a detailed diagram illustrating, viewed from the top, a sheet metal member arranged on the IO system board according to an example of the third embodiment. FIG. 9B illustrates a peripheral portion D2 of the sheet metal member 243-1 viewed from the direction of the top plate 201. The sheet metal member 243-1 includes a first surface 243-1a, a second surface 243-1b, a third surface 243-1c, a fourth surface 243-1d, and a fifth surface 243-1e, the combination of which forms a substantially reverse-S shape when viewed from the direction of the top plate 201.

The sheet metal member 243-1 has a structure in which the first surface 243-1a, the third surface 243-1c, and the fifth surface 243-1e are parallel or substantially parallel to each other. Furthermore, the sheet metal member 243-1 has a structure in which the second surface 243-1b and the fourth surface 243-1d are parallel or substantially parallel to each other. The sheet metal member 243-1 allows, via the screw 216-1, the second section board 209 to be fastened to the first surface 243-1a and allows, via the screw 215-2, the first section board 207 to be fastened to the fifth surface 243-1e.

(Modification of the Sheet Metal Member)

Figure 9C:
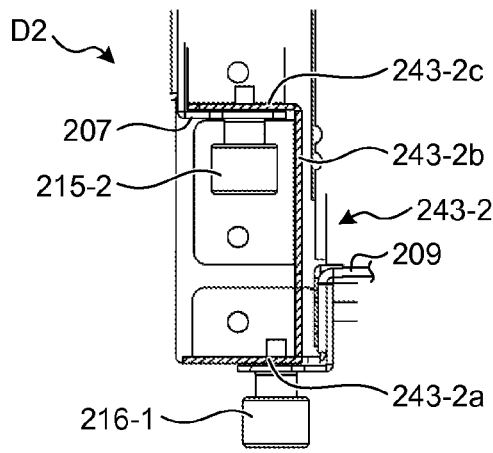
FIG. 9C is a detailed diagram illustrating, viewed from the top, the sheet metal member arranged on the IO system board according to a modification of the third embodiment.

In the example of the third embodiment, a sheet metal member 243-2 may also be used instead of the sheet metal member 243-1. FIG. 9C is a detailed diagram illustrating, viewed from the top, the sheet metal member arranged on the IO system board according to a modification of the third embodiment. FIG. 9C illustrates the peripheral portion of the sheet metal member 243-2 viewed from the direction of the top plate 201.

The sheet metal member 243-2 includes a first surface 243-2a, a second surface 243-2b, a third surface 243-2c, the combination of which forms a substantially angular-U shape when viewed from the direction of the top plate 201. The sheet metal member 243-2 has a structure in which the first surface 243-2a and the third surface 243-2c are parallel or substantially parallel to each other. Furthermore, the sheet metal member 243-2 has a structure in which the second surface 243-2b is arranged perpendicular to or substantially perpendicular to the first surface 243-2a and the third surface 243-2c. The sheet metal member 243-2 allows, via the screw 216-1, the second section board 209 to be fastened to the first surface 243-2a and allows, via the screw 215-2, the first section board 207 to be fastened to the third surface 243-2c.

By using the sheet metal member 243-1 or the sheet metal member 243-2 having the structure illustrated in FIG. 9B and FIG. 9C, respectively, it is possible to efficiently use a fastening portion of the first section board 207 using the screw 215-2 and a fastening portion of the second section board 209 using the screw 216-1 by overlapping them with each other. Accordingly, the arrangement space between the riser unit Ua1 and the riser unit Ua2 may be reduced when they are arranged; therefore, it is possible to reduce the size of the main circuit board 212 and thus possible to reduce the size of the casing of the IO system board 200b.

(Top View of an IO System Board According to an Example of the Third Embodiment)

Figure 10A:
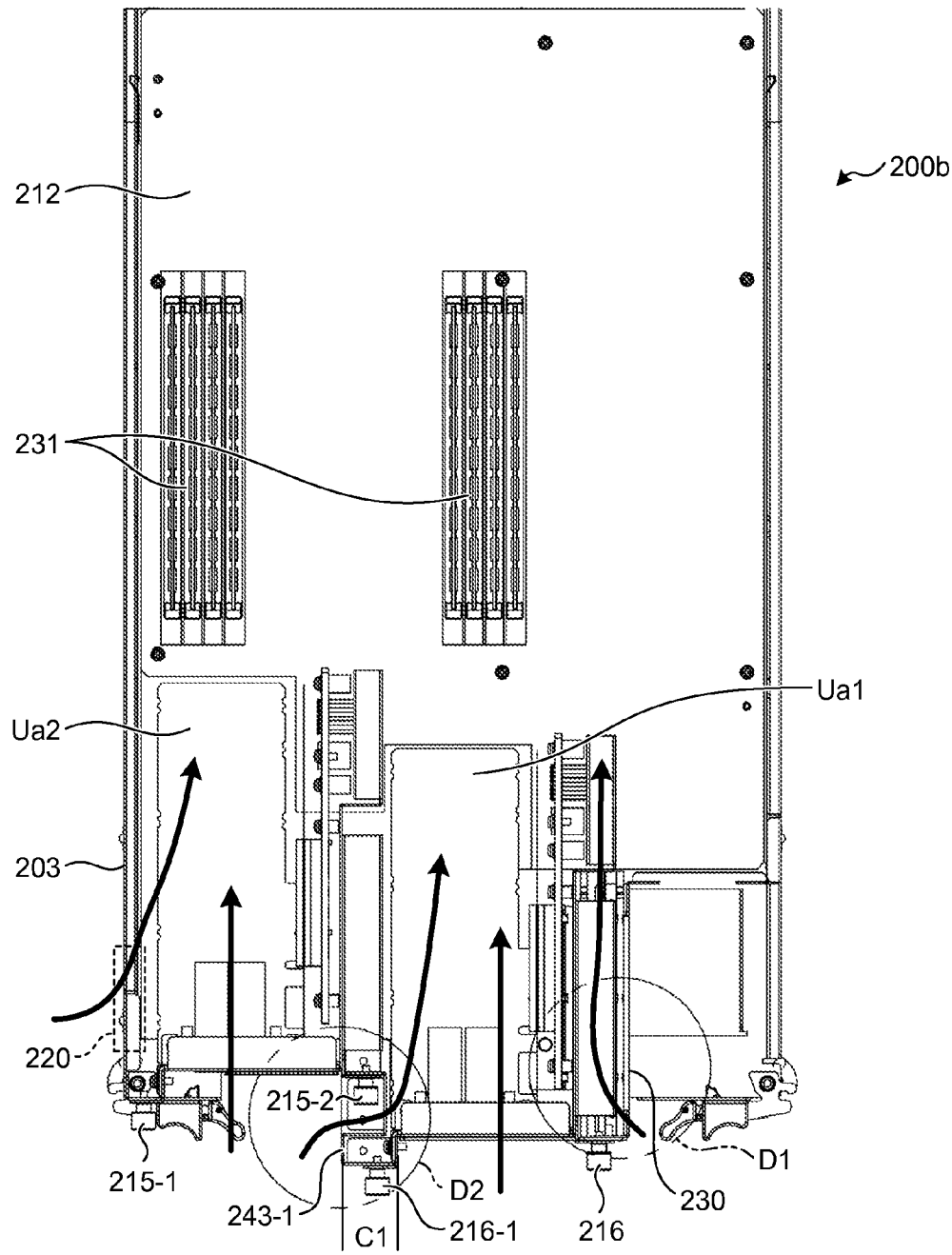
FIG. 10A is a top view of the IO system board according to an example of the third embodiment.

FIG. 10A is a top view of the IO system board according to an example of the third embodiment. As illustrated in FIG. 10A, the IO system board 200b includes the sheet metal member 243-1 instead of the third section board 211 when compared in a case of the IO system board 200a according to the example of the second embodiment.

As illustrated in FIG. 10A, the cooling air flows into the casing of the IO system board 200b from the ventilating holes 220 included in the first side surface plate 203, the ventilating holes included in the first section board 207, and the ventilating holes included in the second section board 209. Furthermore, the cooling air flows into the casing of the IO system board 200b from the ventilating holes included in the sheet metal member 243-1 and the fourth section board 230. Accordingly, because the cooling air flows into the casing of the IO system board 200b from a lot of ventilating holes, it is possible to efficiently cool the electronic components 231 and 232.

Furthermore, because the arrangement space "C1" (see FIG. 11A) of the riser unit Ua1 and the riser unit Ua2 may be reduced, it is possible to reduce the size of the main circuit board 212, and thus possible to implement high-density mounting of electronic components on the main circuit board 212.

(Front View of the IO System Board According to an Example of the Third Embodiment)

Figure 10B:
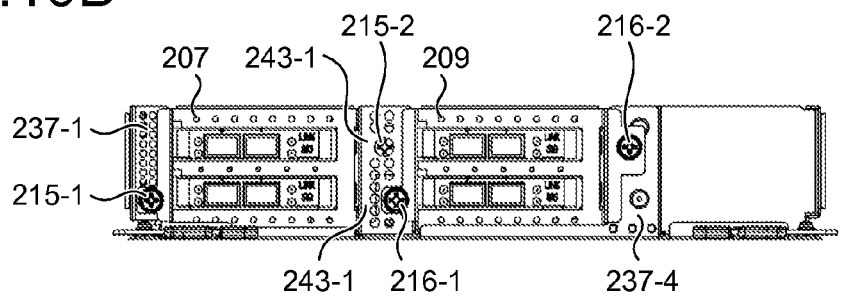
FIG. 10B is a rear view of the IO system board according to an example of the third embodiment.

FIG. 10B is a rear view of the IO system board according to an example of the third embodiment. FIG. 10B illustrates the IO system board 200b according to an example of the third embodiment when viewed from the direction of the first section board 207 and the second section board 209.

As illustrated in FIG. 10B, the first section board 207 is secured to the IO system board 200b by engaging the screw 215-1 and the screw 215-2 with screw holes of the section board 237-1 and the sheet metal member 243-1, respectively. The section board 237-1 and the sheet metal member 243-1 are arranged perpendicular to the main circuit board 212.

Furthermore, as illustrated in FIG. 10B, the second section board 209 is secured to the IO system board 200b by engaging the screw 216-1 and the screw 216-2 with screw holes of the sheet metal member 243-1 and the section board 237-4, respectively.

(Advantage of an Example of the Third Embodiment)

In the example of the third embodiment, the sheet metal member 243-1 is used instead of the third section board 211 according to the example of the second embodiment. Accordingly, it is possible to overlap a fastening portion of the first section board 207 using the screw 215-2 with a fastening portion of the second section board 209 using the screw 216-1. Accordingly, the arrangement space "C" illustrated in FIG. 10A between the riser unit Ua1 and the riser unit Ua2 may be reduced. Therefore, it is possible to reduce the size of the main circuit board 212 and thus possible to implement high-density mounting of electronic components on the main circuit board 212, which reduces the size of the casing of the IO system board 200b.

(Inflow Direction of the Cooling Air Over the IO System Board According to a Conventional Technology)

Figure 11A:
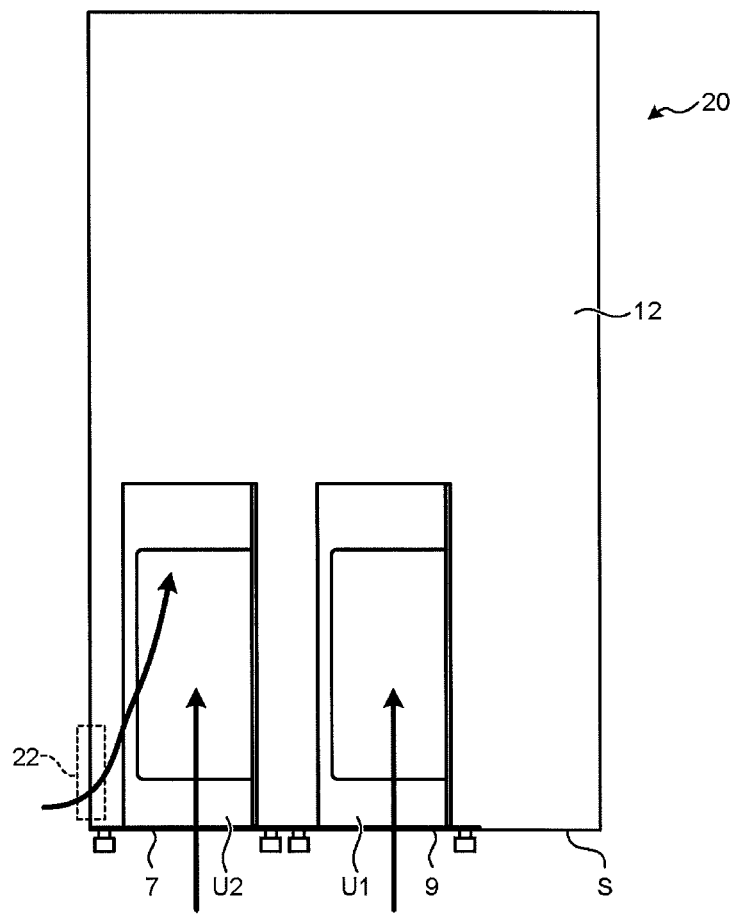
FIG. 11A is a schematic diagram illustrating the inflow direction of cooling air over a system board according to a conventional technology.
Figure 11B:
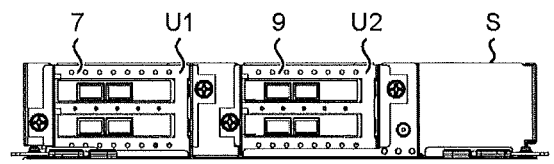
FIG. 11B is a rear view of the system board according to the conventional technology.

FIG. 11A is a schematic diagram illustrating the inflow direction of cooling air over a system board according to a conventional technology. FIG. 11B is a rear view of the system board according to the conventional technology. As illustrated in FIGS. 11A and 11B, on the system board 20 according to the conventional technology, the section board 7 of the riser unit U1 and the section board 9 of the riser unit U2 are arranged to be aligned in the same plane of the front surface S that is perpendicular to the main circuit board 12.

Accordingly, electronic components arranged on the sub circuit board of the riser unit U1 is cooled by the cooling air flowing from vent holes included in the section board 9. Furthermore, electronic components arranged on the sub circuit board of the riser unit U2 is cooled by the cooling air flowing from vent holes included in the section board 7 and a ventilating hole 22. However, on the system board 20, the cooling efficiency is low because the amount of the cooling air that cools the electronic components arranged on each of the sub circuit boards of the riser unit U1 and the riser unit U2 is insufficient. The technology disclosed in the present invention is provided in order to solve this problem.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it is should be understood that the various changes, substitutions, and alterations could be made hereto without departing from the spirit and scope of the invention.

What is claimed is:

1. An electronic device comprising:
a casing that includes a top plate, a base plate arranged opposite the top plate, a first side surface plate, a second side surface plate arranged opposite the first side surface plate, a back surface plate, a first section board arranged opposite the back surface plate and that has first ventilating holes, a second section board arranged, by being shifted forward, parallel to the first section board and that has second ventilating holes, and a third section board arranged among the top plate, the base plate, the first section board, and the second section board, arranged parallel to the first side surface plate, and that has third ventilating holes;
a main circuit board arranged in a space in the casing; and
a first sub circuit board that has a first heat-generating component and arranged in a space bounded by the second section board and the third section board on the main circuit board.

2. The electronic device according to claim 1, further comprising:
a first connector arranged on the main circuit board; and
a first connecting circuit board that has a second connector and arranged perpendicular to the main circuit board by being connected to the first connector, wherein
the first sub circuit board is arranged opposite the main circuit board by being connected to the second connector.

3. The electronic device according to claim 1, further comprising a second sub circuit board that has a second heat-generating component and arranged in a space bounded by the first side surface plate and the first section board on the main circuit board.

4. The electronic device according to claim 3, further comprising:
a third connector arranged on the main circuit board; and
a second connecting circuit board that has a fourth connector and arranged perpendicular to the main circuit board by being connected to the third connector, wherein
the second sub circuit board is arranged opposite the main circuit board by being connected to the fourth connector.

5. The electronic device according to claim 3, wherein a distance a front edge of the first sub circuit board is shifted forward with respect to a front edge of the second sub circuit board is equal to or less than a distance the second section board is shifted forward with respect to the first section board.

6. The electronic device according to claim 5, wherein, on the main circuit board, a third heat-generating component is arranged in a space obtained by making the first sub circuit board shifted with respect to the second sub circuit board.

7. The electronic device according to claim 6, further comprising a cooling device, wherein
the first side surface plate includes fourth ventilating holes,
the first sub circuit board is cooled by the cooling device via the second ventilating holes and the third ventilating holes, and
the second sub circuit board is cooled by the cooling device via the first ventilating holes and the fourth ventilating holes.

8. An electronic device comprising:
a casing that includes a top plate, a base plate arranged opposite the top plate, a first side surface plate, a second side surface plate arranged opposite the first side surface plate, a back surface plate, a first section board arranged opposite the back surface plate and that has first ventilating holes, a second section board arranged, by being shifted forward, parallel to the first section board and that has second ventilating holes, and a portion of a sheet metal member arranged among the top plate, the base plate, the first section board, and the second section board, arranged parallel to the first side surface plate, and that has third ventilating holes;
a main circuit board arranged in a space in the casing;
a first sub circuit board that has a first heat-generating component and arranged in a space bounded by the second section board and the portion of the sheet metal member on the main circuit board;
a second sub circuit board that has a second heat-generating component and arranged in a space bounded by the first side surface plate and the first section board on the main circuit board;
a third connector arranged on the main circuit board; and
a second connecting circuit board that has a fourth connector and arranged perpendicular to the main circuit board by being connected to the third connector,
wherein the second sub circuit board is arranged opposite the main circuit board by being connected to the fourth connector, and
wherein the sheet metal member is constituted by first to fifth surfaces that form a substantially reverse-S shape when viewed from the direction of the top plate, the first surface, the third surface, and the fifth surface being substantially parallel to each other and the second surface and the fourth surface being substantially parallel to each other, wherein the sheet metal member allows, via a first fastening member, the second section board to be fastened to the first surface and allows, via a second fastening member, the first section board to be fastened to the fifth surface, the portion of the sheet metal member is the third surface.

9. An electronic device comprising:
a casing that includes a top plate, a base plate arranged opposite the top plate, a first side surface plate, a second side surface plate arranged opposite the first side surface plate, a back surface plate, a first section board arranged opposite the back surface plate and that has first ventilating holes, a second section board arranged, by being shifted forward, parallel to the first section board and that has second ventilating holes, and a portion of a sheet metal member arranged among the top plate, the base plate, the first section board, and the second section board, arranged parallel to the first side surface plate, and that has third ventilating holes;

a main circuit board arranged in a space in the casing;

a first sub circuit board that has a first heat-generating component and arranged in a space bounded by the second section board and the portion of the sheet metal member on the main circuit board;

a second sub circuit board that has a second heat-generating component and arranged in a space bounded by the first side surface plate and the first section board on the main circuit board;

a third connector arranged on the main circuit board; and a second connecting circuit board that has a fourth connector and arranged perpendicular to the main circuit board by being connected to the third connector, wherein the second sub circuit board is arranged opposite the main circuit board by being connected to the fourth connector, and wherein the sheet metal member is constituted by first to third surfaces that form a substantially angular-U shape when viewed from the direction of the top plate, the first surface and the third surface being substantially parallel to each other and the second surface being perpendicular to the first surface and the third surface, wherein the sheet metal member allows, via a first fastening member, the second section board to be fastened to the first surface and allows, via a second fastening member, the first section board to be fastened to the third surface, the portion of the sheet metal member is the second surface.

\* \* \* \* \*